US012763125B2

(12) United States Patent
Ito

(10) Patent No.: US 12,763,125 B2
(45) Date of Patent: Oct. 13, 2026

(54) ROW HAMMER REFRESH ADDRESS CALCULATION METHOD AND CALCULATION CIRCUIT, AND SEMICONDUCTOR MEMORY DEVICE MOUNTING THE CALCULATION CIRCUIT

(71) Applicant: Winbond Electronics Corp., Taichung City (TW)

(72) Inventor: Yutaka Ito, Yokohama (JP)

(73) Assignee: WINBOND ELECTRONICS CORP, Taichung City (TW)

( * ) Notice: Subject to any disclaimer, the term of this patent is extended or adjusted under 35 U.S.C. 154(b) by 257 days.

(21) Appl. No.: 18/813,765

(22) Filed: Aug. 23, 2024

(65) Prior Publication Data

US 2025/0078899 A1 Mar. 6, 2025

(30) Foreign Application Priority Data

Sep. 6, 2023 (JP) ................................ 2023-144183

(51) Int. Cl.
*G11C 11/406* (2006.01)
*G11C 11/408* (2006.01)

(52) U.S. Cl.
CPC .. *G11C 11/40622* (2013.01); *G11C 11/40615* (2013.01); *G11C 11/4085* (2013.01)

(58) Field of Classification Search
CPC ................................................ G11C 11/40622
See application file for complete search history.

(56) References Cited

U.S. PATENT DOCUMENTS

2017/0287547 A1 10/2017 Ito et al.
2019/0103147 A1 4/2019 Jones et al.
2019/0385667 A1 12/2019 Morohashi et al.
2024/0211344 A1 * 6/2024 Bains .................... G11C 29/44

FOREIGN PATENT DOCUMENTS

CN 110942797 A 3/2020
CN 112997251 A 6/2021
TW 202013371 A 4/2020
WO WO 2019/026197 A1 2/2019

* cited by examiner

*Primary Examiner* — Hoai V Ho
(74) *Attorney, Agent, or Firm* — Birch, Stewart, Kolasch & Birch, LLP

(57) ABSTRACT

A Row Hammer Refresh Address (RHA) calculation method, calculation circuit, and semiconductor memory device that are capable of performing RHA calculation at high speed on a small circuit scale are provided. The control unit of the RHA calculation circuit preferentially calculates the address obtained using a lighter operation (merely by inverting the least significant bit) as the adjacent RHA between the adjacent RHAs on both sides based on the refreshed seed address when the seed address is refreshed. Alternatively, it preferentially calculates the address obtained using a lighter operation (merely by inverting the least significant bit) as the further adjacent RHA between the further adjacent RHAs on both sides based on the refreshed seed address when the seed address is refreshed.

12 Claims, 15 Drawing Sheets

Adjacent RHA

| Physical address Hexadecimal expression | Logical address Hexadecimal expression | Logical address Binary expression | |
|---|---|---|---|
| (0) | 0 | 0000 | |
| (1) | 1 | 0001 | |
| (2) | 2 | 0010 | Seed address of the A seed |
| (3) | 3 | 0011 | Prioritized adjacent RHA |
| (4) | 4 | 0100 | |
| (5) | 5 | 0101 | |
| (6) | 6 | 0110 | Prioritized adjacent RHA |
| (7) | 7 | 0111 | Seed address of the A seed |
| (8) | e | 1110 | |
| (9) | f | 1111 | |
| (a) | c | 1100 | |
| (b) | d | 1101 | |
| (c) | a | 1010 | Prioritized adjacent RHA |
| (d) | b | 1011 | Seed address of the A seed |
| (e) | 8 | 1000 | Non-prioritized adjacent RHA |
| (f) | 9 | 1001 | |

Further-adjacent RHA

| Physical address Hexadecimal expression | | Logical address Hexadecimal expression | Logical address Binary expression | |
|---|---|---|---|---|
| (0) | | 0 | 0000 | Prioritized further-adjacent RHA |
| (1) | | 1 | 0001 | |
| (2) | | 2 | 0010 | Seed address of the B seed |
| (3) | | 3 | 0011 | |
| (4) | | 4 | 0100 | |
| (5) | | 5 | 0101 | |
| (6) | A3 = 0 | 6 | 0110 | |
| (7) | | 7 | 0111 | |
| (8) | | e | 1110 | Seed address of the B seed |
| (9) | A3 = 1 | f | 1111 | |
| (a) | | c | 1100 | Prioritized further-adjacent RHA |
| (b) | | d | 1101 | Non-prioritized further-adjacent RHA |
| (c) | | a | 1010 | |
| (d) | | b | 1011 | Seed address of the B seed |
| (e) | | 8 | 1000 | |
| (f) | | 9 | 1001 | Prioritized adjacent RHA |

FIG. 6

| Logical address | | | | |
|---|---|---|---|---|
| Seed address of the A seed | Upper-side adjacent RHA | Lower-side adjacent RHA | Prioritized adjacent RHA | Non-prioritized adjacent RHA |
| 0 | 9 | 1 | 1 | 9 |
| 1 | 0 | 2 | 0 | 2 |
| 2 | 1 | 3 | 3 | 1 |
| 3 | 2 | 4 | 2 | 4 |
| 4 | 3 | 5 | 5 | 3 |
| 5 | 4 | 6 | 4 | 6 |
| 6 | 5 | 7 | 7 | 5 |
| 7 | 6 | e | 6 | e |
| 8 | b | 9 | 9 | b |
| 9 | 8 | 0 | 8 | 0 |
| a | d | b | b | d |
| b | a | 8 | a | 8 |
| c | f | d | d | f |
| d | c | a | c | a |
| e | 7 | f | f | 7 |
| f | e | c | e | c |

FIG. 8A

| Logical address | | | | |
|---|---|---|---|---|
| Seed address of the B seed | Upper-side further-adjacent RHA | Lower-side further-adjacent RHA | Prioritized further-adjacent RHA | Non-prioritized further-adjacent RHA |
| 0 | 2 | 8 | 2 | 8 |
| 1 | 3 | 9 | 3 | 9 |
| 2 | 4 | 0 | 0 | 4 |
| 3 | 5 | 1 | 1 | 5 |
| 4 | 6 | 2 | 6 | 2 |
| 5 | 7 | 3 | 7 | 3 |
| 6 | e | 4 | 4 | e |
| 7 | f | 5 | 5 | f |
| 8 | 0 | a | a | 0 |
| 9 | 1 | b | b | 1 |
| a | 8 | c | 8 | c |
| b | 9 | d | 9 | d |
| c | a | e | e | a |
| d | b | f | f | b |
| e | c | 6 | c | 6 |
| f | d | 7 | d | 7 |

FIG. 8B

| Physical address | Logical address |
|---|---|
| (0) | 0 |
| (1) | 1 |
| (2) | 2 |
| (3) | 3 |
| (4) | 4 |
| (5) | 5 |
| (6) | 6 |
| (7) | 7 |
| (8) | e |
| (9) | f |
| (a) | c |
| (b) | d |
| (c) | a |
| (d) | b |
| (e) | 8 |
| (f) | 9 |

FIG. 8C

| | | | | | | | | |
|---|---|---|---|---|---|---|---|---|
| PM2 | L | | | | H | | | |
| RHR2nd | L | | H | | L | | H | |
| Ain<0> | L | H | L | H | | | | |
| Ain<1>~Ain<3> | | | | | L | H | L | H |
| SWPM | L | H | | L | L | H | | L |

FIG. 9

<table>
<tr><td>PM2</td><td colspan="2">LOW</td><td colspan="2">HIGH</td></tr>
<tr><td>RHR2nd</td><td>LOW</td><td>LOW</td><td>LOW</td><td>LOW</td></tr>
<tr><td rowspan="4">RHA</td><td>!A0</td><td>!A0</td><td>A0</td><td>A0</td></tr>
<tr><td>A1</td><td>A1 ^ !{(A0^A1^A3) | (A1^A2)}</td><td>!A1</td><td>A2</td></tr>
<tr><td>A2</td><td>A2 ^ !{(A0^A1^A3) | !(A1^A2)}</td><td>A2</td><td>A1</td></tr>
<tr><td>A3</td><td>A3 ^ !{(A0^A1^A3) | (A1^A2)}</td><td>A3</td><td>A3 ^ !(A1^A2)</td></tr>
<tr><td>C3</td><td>0</td><td>(!A0^A3) & !(A1 | A2)</td><td>0</td><td>!(A1 | A2)</td></tr>
</table>

! : NOT, | : OR, & : AND, ^ : XOR

FIG. 11

ROW HAMMER REFRESH ADDRESS CALCULATION METHOD AND CALCULATION CIRCUIT, AND SEMICONDUCTOR MEMORY DEVICE MOUNTING THE CALCULATION CIRCUIT

CROSS REFERENCE TO RELATED APPLICATIONS

This Application claims priority of Japanese Patent Application No. 2023-144183, filed on Sep. 6, 2023, the entirety of which is incorporated by reference herein.

BACKGROUND OF THE INVENTION

Field of the Invention

The present invention relates to a semiconductor memory device, such as a Dynamic Random Access Memory (DRAM), that requires a refresh operation, which additionally performs a row hammer refresh, as well as a row hammer refresh address calculation method and a calculation circuit in order to save data.

Description of the Related Art

Due to the requirements of the circuit architecture of dynamic random access memory, a refresh operation must be performed every once in a while to refresh the data stored in the memory cells. Among them, the row address that is frequently accessed is called RHA. In the memory cell close to the row address of the RHA, leakage current is caused by memory array noise of the access action, minority carriers, or a few device defects.

With the miniaturization of semiconductor memory devices, this type of leakage current increases significantly, making it difficult to retain data by relying solely on traditional refresh operations. Therefore, a frequently accessed row address is recorded as a row hammer address (RHA), and the two row addresses that are adjacent to the row hammer address, as well as the two row addresses further adjacent to those two adjacent row addresses, are also refreshed. However, the above-mentioned calculation of the row address may become complicated, and this increases the calculation time, causing the circuit scale to become larger.

BRIEF SUMMARY OF THE INVENTION

The present invention provides a semiconductor memory device, including: the memory array that includes memory cells arranged in rows and columns; and a row hammer refresh address (RHA) calculation circuit; wherein the memory cells corresponding to a word line having the RHA calculated by the RHA calculation circuit are refreshed.

BRIEF DESCRIPTION OF THE DRAWINGS

FIG. 6 is a schematic diagram showing the correspondence between seed addresses and RHAs.

FIG. 8A is a table showing the correspondence between the seed addresses and adjacent RHAs; FIG. 8B is a table showing the correspondence between the seed addresses and further-adjacent RHAs; FIG. 8C is a table showing the correspondence between logical addresses and physical addresses.

FIG. 9 is a table showing signals and information required for switching prioritized adjacent RHAs, non-prioritized adjacent RHAs, prioritized further-adjacent RHAs, non-prioritized further-adjacent RHAs, and the combination thereto.

FIG. 11 shows the logical expressions of the logical operations performed in the RHA calculation unit based on conditions according to the second embodiment of the present invention.

DETAILED DESCRIPTION OF THE INVENTION

Figure 1:
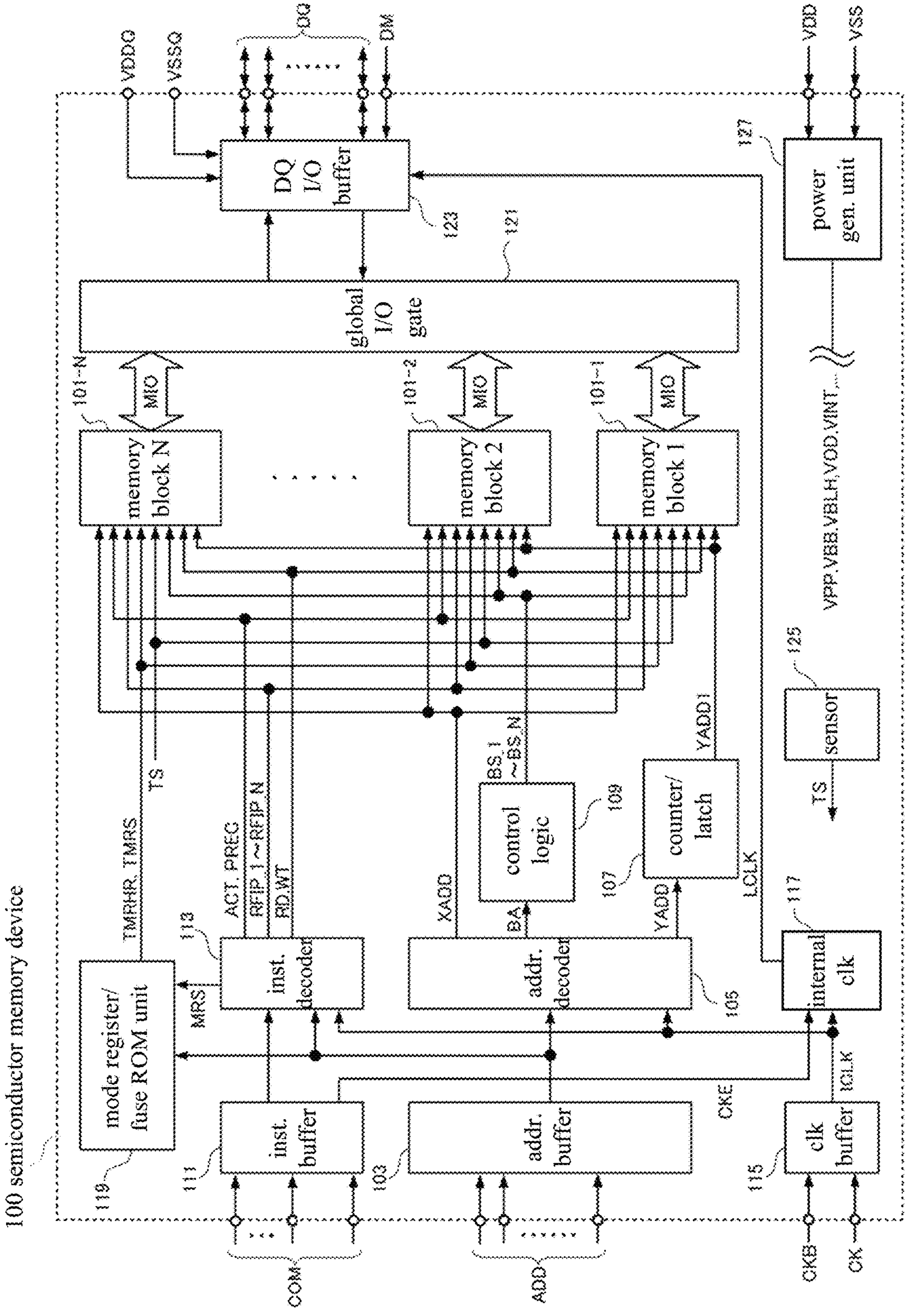
FIG. 1 is a block diagram showing a semiconductor memory device.

FIG. 1 is a block diagram illustrating a semiconductor memory device 100 of a First Embodiment according to the present invention. In addition, in this embodiment, although the case where the semiconductor memory device 100 is a DRAM is taken as an example, the semiconductor memory device 100 may also be, for example, a pseudo-static random access memory (pSRAM) configured to control refresh operations internally.

Referring to FIG. 1, the semiconductor memory device 100 includes: memory blocks 101-1~101-N (N is an integer above 2), an address (addr.) input buffer 103, an address decoder 105, a column address counter and latch 107, block address control logic 109, an instruction (inst.) input buffer 111, an instruction decoder 113, a clock (clk) input buffer 115, an internal clock generation (gen.) unit 117, a mode register and fuse ROM unit 119, a global input/output (I/O) gate 121, a DQ I/O buffer 123, a temperature (temp.) sensor 125, and an internal power generation unit 127. The input data DQ is supplied to the global I/O gate 121 via the DQ I/O buffer 123. In addition, the data supplied to the DQ I/O buffer 123 from the global I/O gate 121 is output as data DQ.

The global I/O gate 121 demultiplexes the data input from the DQ I/O buffer 123 and provides it to the memory blocks 101-1~101-N. The global I/O gate 121 multiplexes the data provided by the memory blocks 101-1~101-N and provides it to the DQ I/O buffer 123.

Each of the memory blocks 101-1~101-N includes a plurality of memory cells arranged in rows and columns. Each memory cell is designated by a row address and a column address. In the memory cell specified by the row address and column address of the memory block 101-*i* (i=1~N) of the own blocks that are specified by a block selection signal BS_i (i=1~N), through the global I/O gate 121 and the DQ I/O buffer 123, the input data is written according to a write signal WT. In addition, the data written into the memory cell specified by the column address and the row address of the memory block 101-*i* of the own block that are specified by the block selection signal BS_i is read through the global I/O gate 121 and the DQ I/O buffer 123 according to a read signal RD.

Via the address input buffer 103, the input address is provided to the address decoder 105, the instruction decoder 113, and the mode register and fuse ROM unit 119. The address decoder 105 decodes the input address and outputs the decoding results as block address BA, row address XADD and column address YADD. The column address counter and latch 107 mainly latches the column address YADD, and provides it as the column address YADD1 to the memory blocks 101-1~101-N. The block address control logic 109 decodes the block address BA and provides the decoded block selection signals BS_1~BS_N to the memory blocks 101-1~101-N respectively.

A command COM input from the outside is supplied to the command decoder 113 via the command input buffer 111. The instruction decoder 113 decodes the instructions, calculates signals ACT, PREC, and RFIP_1~RFIP_N, the read signal RD, the write signal WT, and a signal MRS based on the decoding result and the address, and provides them to the memory blocks 101-1~101-N. Complementary clocks CK and CKB input from the outside are converted into a clock ICLK by the clock input buffer 115, and the clock ICLK is provided to the command decoder 113, the address decoder 105, and the internal clock generation unit 117. The internal clock generation unit 117 generates the internal clock LCLK based on a signal CKE provided by the command input buffer 111 and the clock ICLK. The internal clock LCLK is provided to the DQ I/O buffer 123. The mode register and fuse ROM unit 119 calculates signals TMRHR and TMRS based on the signal MRS and the address, and provides the signals TMRHR and TMRS to the memory blocks 101-1~101-N.

The temperature sensor 125 measures the temperature of the semiconductor memory device 100, outputs temperature data TS showing the measurement results, and provides the temperature data TS to the memory blocks 101-1~101-N. The internal power generation unit 127 generates internal power supplies VPP, VBB, VBLH, VOD, VINT, etc., which are provided to various parts of the semiconductor memory device 100 based on a power supply VDD and a power supply VSS input from the outside.

Figure 2:
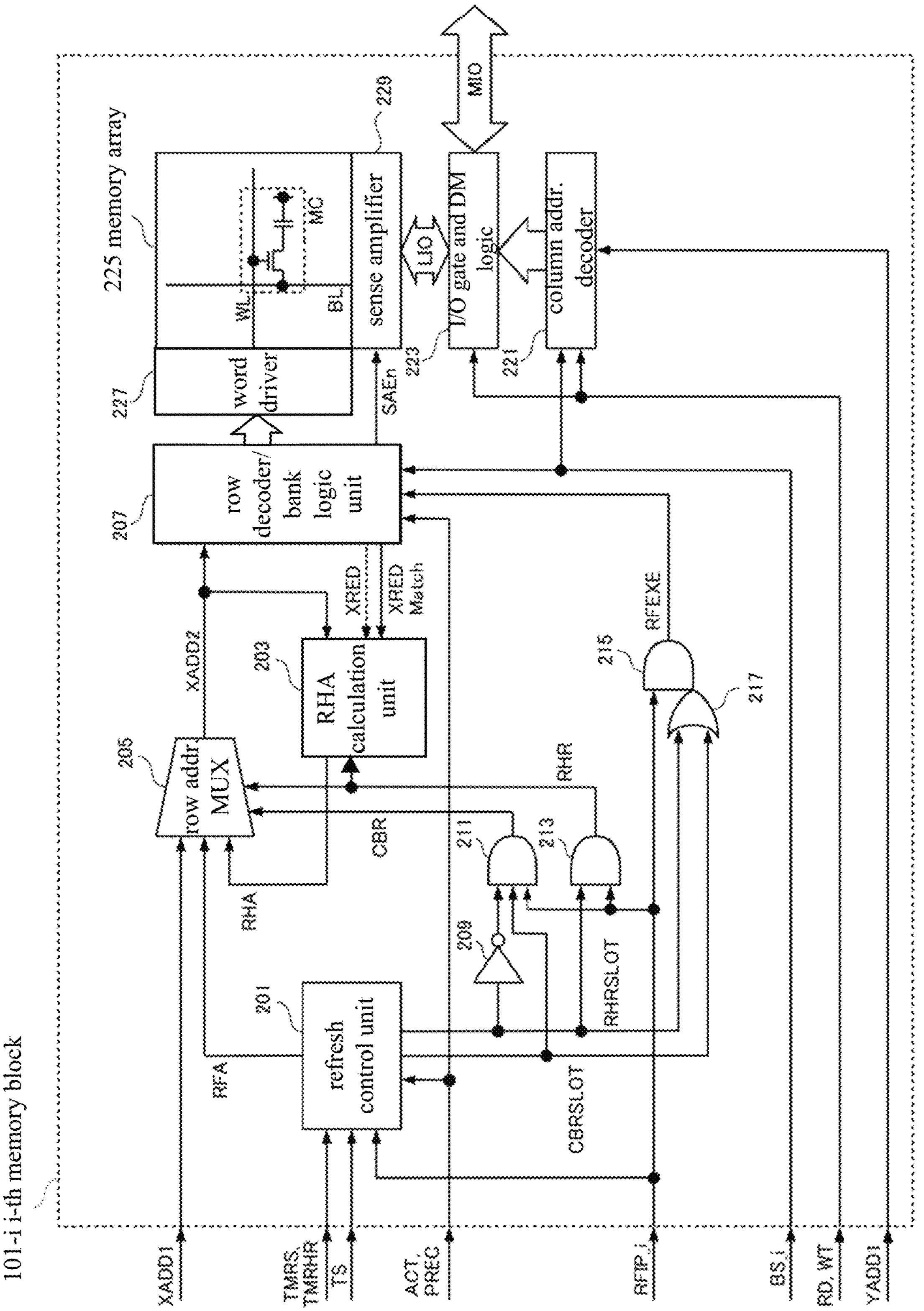
FIG. 2 is a block diagram showing the structure of an i-th memory block shown in FIG. 1.

FIG. 2 is a block diagram showing the structure of the i-th memory block 101-*i* shown in FIG. 1. The i-th memory block 101-*i* includes: a refresh control unit 201, a row hammer refresh address (RHA) calculation unit 203, a row address multiplexer (MUX) 205, a row decoder and memory bank logic unit 207, an inverter 209, AND gates 211, 213, and 215, an OR gate 217, a column address decoder 221, I/O gate and DM logic 223, memory array 225, word driver 227 and sense amplifier 229. In addition, the RHA calculation unit 203 corresponds to the "RHA calculation circuit" of the present invention.

The refresh control unit 201 inputs the signals TMRS, TMRHR, ACT, and PREC, the temperature data TS, and clock RFIP_i, and the usual refresh address RFA, signal CBRSLOT, and signal RHRSLOT are calculated according to the signals TMRS, TMRHR, ACT, and PREC, the temperature data TS, and clock RFIP_i. The RHA calculation unit 203 calculates the row hammer refresh address RHA based on the row address XADD2 (hereinafter, the row hammer refresh address will be referred to as "RHA"). The row address multiplexer 205 provides the row address XADD2 to the row decoder and memory bank logic 207 in order to access (write, read or refresh) the memory array 225.

However, if the memory cell located in the X redundant area is used to replace the memory cell located in the row specified by the row address XADD2, the signal XRED Match is activated. At this time, as the reference address for RHA calculation, the row address XRED of the X redundancy area is used instead of the row address XADD2. Here, the row address XRED is the row address of the memory cell that is actually accessed, and the RHA calculation unit 203 inputs the row address XRED from the row decoder and memory bank logic unit 207. In addition, the RHA calculation unit 203 also uses the signals ACT, PREC, and RHR when calculating the RHA.

The row address multiplexer 205 selects any one of the row address XADD1, the usual refresh address RFA, and the row hammer refresh address RHA as the row address XADD2 based on the signals CBR and RHR. Row address XADD2 is provided to the row decoder and memory bank logic unit 207.

The signal CBR has a logic level of the logical AND operation result of the logically inverted signal of the signal RHRSLOT, the signal CBRSLOT, and the clock RFIP_i, which is obtained by passing these signals through the inverter 209 and the AND gate 211. The signal RHR has a logic level of the logical AND operation result of the signal RHRSLOT and the clock RFIP_i, which is calculated by passing the signal RHRSLOT and the clock RFIP_i through the AND gate 213.

The signal RFEXE has a logic level of the logical AND operation result of the clock RFIP_i and the logical OR operation result of the signal CBRSLOT and the signal RHRSLOT, which is calculated by passing the signal CBRSLOT, the signal RHRSLOT, and the clock RFIP_i through the OR gate 217 and the AND gate 215.

When the row decoder and memory bank logic unit 207 selects its own memory block 101-*i* by the block selection signal BS_i, it decodes the column address XADD2, and selects the word line WL to be driven by the word driver 227 of each row word line WL provided in the memory array 225.

When the block selection signal BS_i selects its own memory block 101-*i*, the column address decoder 221 decodes the column address YADD1, and selects the sense amplifier 229 of the bit line BL to be sensed the sense amplifier 229 configured in each bit line BL of the memory array 225. The selected sense amplifier 229 senses the corresponding bit line BL at the timing according to the signal SAEn.

The I/O gate and DM logic 223 exists between the memory I/O bus MIO and the column I/O bus LIO, and control the I/O direction of data based on the write signal WT and the read signal RD.

Figure 3:
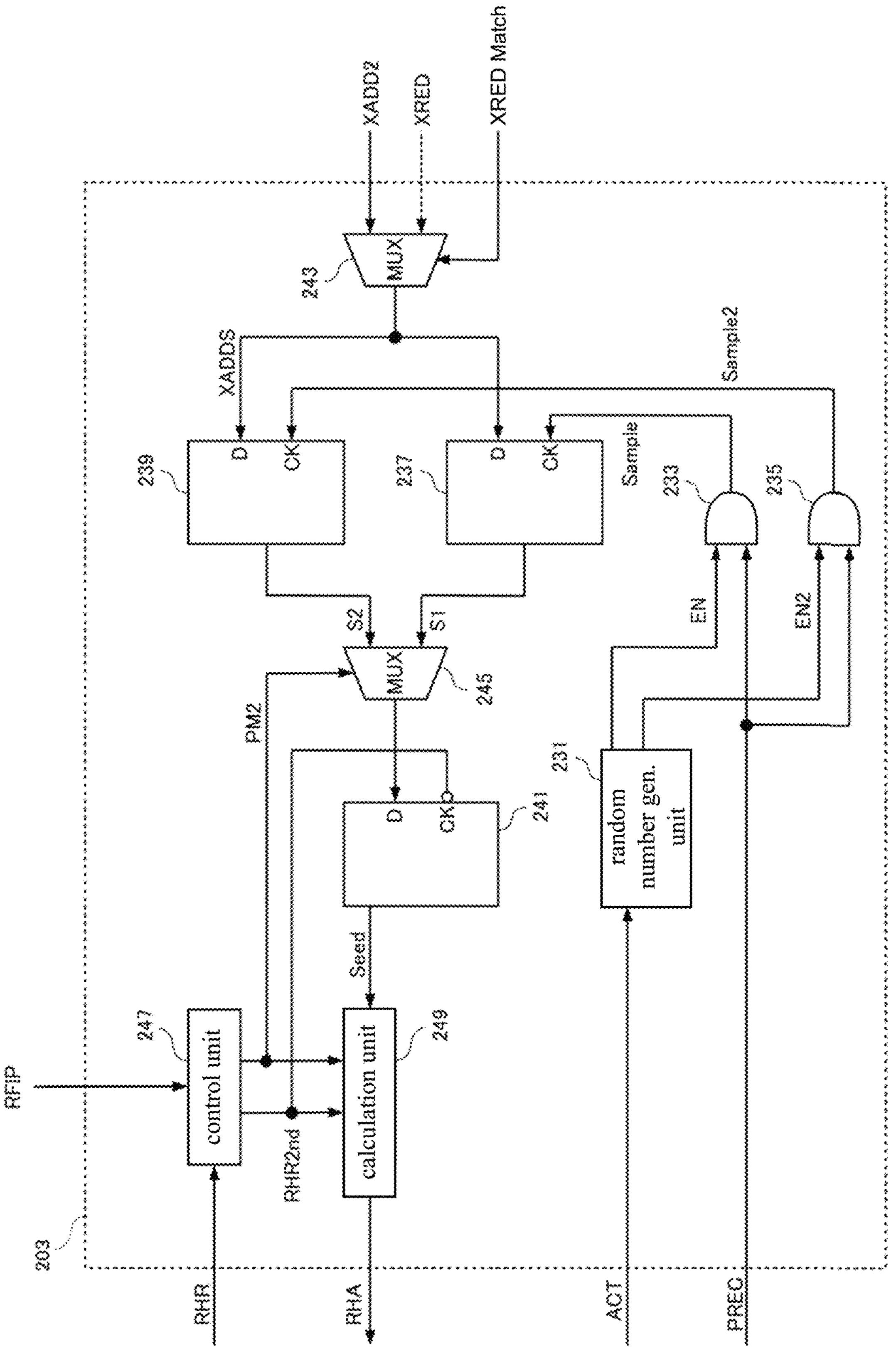
FIG. 3 is a block diagram showing the structure of a row hammer refresh address (RHA) calculation unit shown in FIG. 2.
Figure 4:
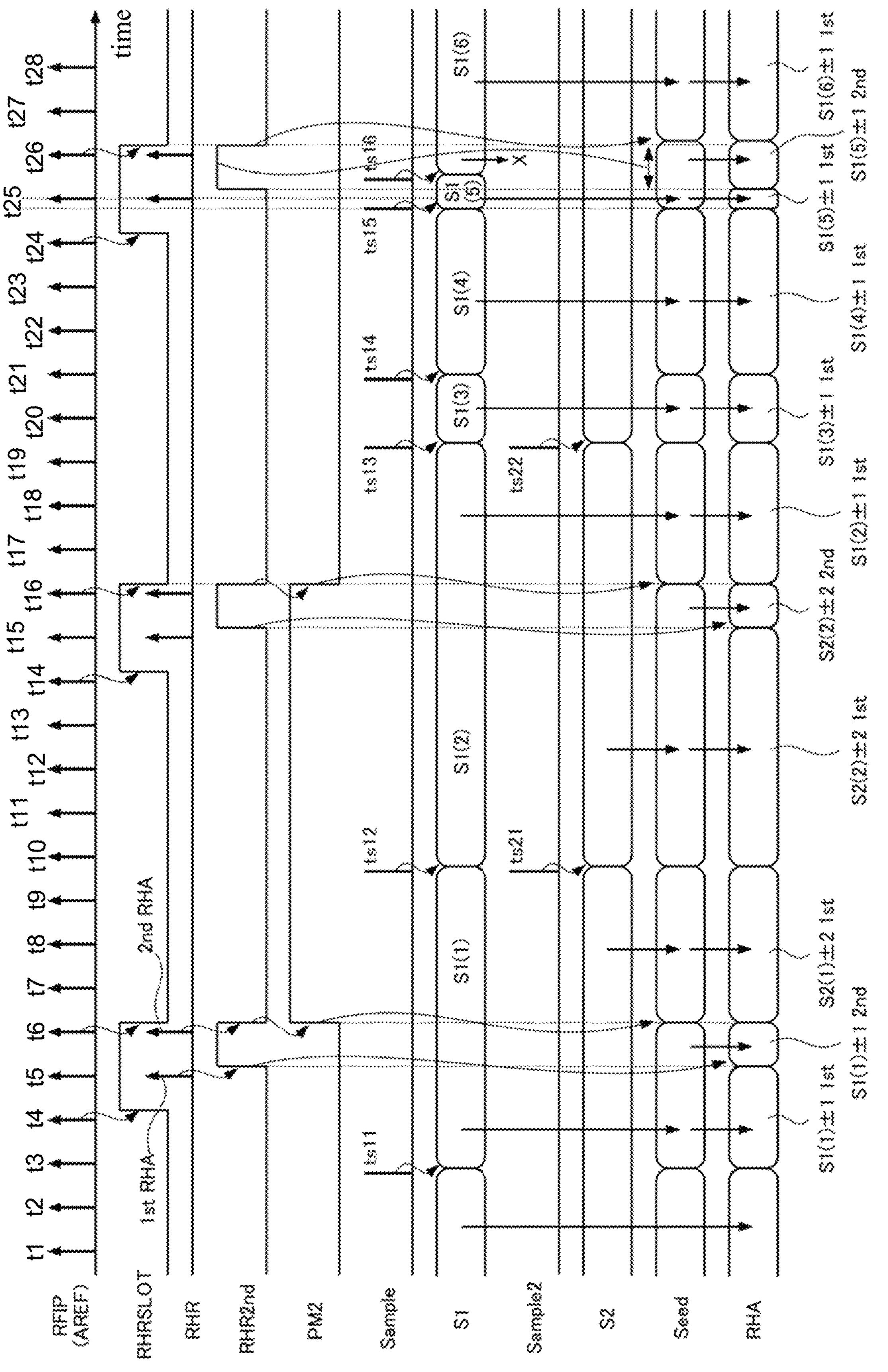
FIG. 4 is a timing diagram showing signals associated with the RHA calculation unit shown in FIG. 2.

FIG. 3 is a block diagram showing the structure of the RHA calculation unit 203 shown in FIG. 2. FIG. 4 is a timing diagram showing the signals associated with the RHA calculation unit 203. Referring to FIG. 3, the RHA calculation unit 203 includes: a random number generation unit 231, AND gates 233 and 235, latches 237, 239, and 241, multiplexers 243 and 245, a control unit 247, and a calculation unit 249.

For the signal EN generated by the random number generation unit 231 at random timing, through the logical AND operation of the AND gate 233 and the signal PREC, the first sampling signal Sample is calculated at random timing as shown in FIG. 4. For the signal EN2 generated at random timing independently of the signal EN in the random number generation unit 231, through the logical AND operation of the AND gate 235 and the signal PREC, the second sampling signal Sample2 is calculated at the random timing in FIG. 4.

The row address XADD2 is provided to the multiplexer 243 from the row address multiplexer 205 via the row decoder and memory bank logic unit 207. In addition, the row address XRED and the signal XRED Match are provided from the row decoder and memory bank logic unit 207 to the multiplexer 243.

The multiplexer 243 selects any one of the row address XADD2 and the row address XRED as the row address XADDS according to the signal XRED Match.

The latch 237 will output the signal of the row address XADDS randomly sampled by the first sampling signal Sample as the seed address S1 of the A seed.

The latch 239 outputs the signal of the row address XADDS randomly sampled by the second sampling signal Sample2 as the seed address S2 of the B seed.

The control unit 247 calculates a distance switching signal PM2 and a priority switching signal RHR2nd based on the RHR signal. Here, the distance switching signal PM2 is an example of the "first identification signal", and the priority switching signal RHR2nd is an example of the "second identification signal" of the present invention.

Referring to FIG. 4, the pulses of the clock RFIP continue periodically. Signal RHRSLOT has a period corresponding to the refresh rate. In each period, only the period signal RHRSLOT having a length corresponding to two periods of the clock RFIP has a logic level of H. The signal RHR is obtained using the logical AND operation of the clock RFIP and the signal RHRSLOT. Therefore, two consecutive pulses of signal RHR are generated in each cycle of signal RHRSLOT.

With the first pulse of the two consecutive pulses of the signal RHR, the logic level of the priority switching signal RHR2nd changes from L to H, and with the second pulse, the logic level of the priority switching signal RHR2nd changes from H changes to L.

In addition, basically, although the logic level of the distance switching signal PM2 is inverted by the second pulse of the two consecutive pulses of the signal RHR, there are cases where the logic level is not inverted. This part will be described in detail later.

The period from the falling of the priority switching signal RHR2nd to the next falling is one unit period. At the beginning of the unit period, the priority switching signal RHR2nd becomes L, and then when the first pulse of two consecutive pulses of the signal RHR is generated, the priority switching signal RHR2nd becomes H. Then, when the second pulse of the two consecutive pulses of the signal RHR is generated, the priority switching signal RHR2nd becomes L again, and the unit period ends.

The distance switching signal PM2 does not change during the unit period. The distance switching signal PM2 is inverted every unit period, but it also may not be inverted.

When the distance switching signal PM2 is at the logic level of L, in the configuration of the word lines in the memory array, two adjacent word lines on both sides of a word line assigned to the seed address of the A seed are specified. The two addresses assigned to the specified two word lines are calculated as upper-side adjacent RHA and lower-side adjacent RHA respectively. In addition, when the distance switching signal PM2 is at the logic level of H, in the configuration of the word lines in the memory array, two adjacent word lines on both sides of a word line assigned to the seed address of the B seed are specified. The two addresses assigned to the specified two word lines are calculated as upper-side further-adjacent RHA and lower-side further-adjacent RHA respectively. Here, "upper" and "lower" are the order in which word lines are arranged in the memory array.

When the logic level of the priority switching signal RHR2nd is L, in the two RHAs calculated based on the same seed address (the same seed address of the A seed or the same seed address of the B seed), specify the RHA that is calculated ahead in time (i.e., the prioritized RHA). On the other hand, a logic level of H specifies the one that is calculated latter in time (i.e., the non-prioritized RHA).

Therefore, when the distance switching signal PM2 is L and the priority switching signal RHR2nd is L, the prioritized adjacent RHA is designated as the RHA, and when the distance switching signal PM2 is L and the priority switching signal RHR2nd is H, the non-prioritized adjacent RHA is designated as the RHA. When the distance switching signal PM2 is H and the priority switching signal RHR2nd is L, the prioritized further-adjacent RHA is designated as the RHA. When the distance switching signal PM2 is H and the priority switching signal RHR2nd is H, the non-prioritized further-adjacent RHA is designated as the RHA.

When the logic level of the distance switching signal PM2 is L, the multiplexer 245 selects the seed address S1 of the A seed as the seed address. When the logic level of the distance switching signal PM2 is H, the multiplexer 245 selects the seed address S2 of the B seed as the seed address.

When the logic level of the priority switching signal RHR2nd is L, the latch 241 outputs the seed address provided from the multiplexer 245 as the seed address Seed. When the logic level of the priority switching signal RHR2nd is H, the seed address Seed at the moment before the priority switching signal RHR2nd becoming H is directly output.

The calculation unit 249 calculates and outputs four types of RHA based on the seed address Seed according to the combination of the distance switching signal PM2 and the priority switching signal RHR2nd.

In addition, the seed address S1 of the A seed randomly sampled by the latch 237 and the seed address S2 of the B seed randomly sampled by the latch 239 are synthesized into one seed address Seed by the multiplexer 245. Here, in fact, when the logic level of the distance switching signal PM2 is L, the seed address of the A seed is selected as the seed address Seed. On the other hand, when the logic level of the distance switching signal PM2 is H, the seed address of the B seed is selected as the seed address Seed.

Therefore, when the logic levels of the distance switching signal PM2 and the priority switching signal RHR2nd are L and L, the calculation unit 249 calculates the prioritized adjacent RHA selected from the upper-side adjacent RHA and the lower-side adjacent RHA based on the seed address of the A seed through a first operation. In addition, when the logic levels of the distance switching signal PM2 and the priority switching signal RHR2nd are L and H, based on the seed address of the A seed, the non-prioritized adjacent RHA selected from the upper-side adjacent RHA and the lower-side adjacent RHA is calculated through a second operation.

Furthermore, when the logic levels of the distance switching signal PM2 and the priority switching signal RHR2nd are H and L, based on the seed address of the B seed, the prioritized further-adjacent RHA selected from the upper-side further-adjacent RHA and the lower-side further-adjacent RHA is calculated through a third operation. In addition, when the logic levels of the distance switching signal PM2 and the priority switching signal RHR2nd are H and H, based on the seed address of the B seed, the non-prioritized further-adjacent RHA selected from the upper-side further-adjacent RHA and the lower-side further-adjacent RHA is calculated through a fourth operation.

Here, the operation amount of the second operation is larger than the operation amount of the first operation, and the operation amount of the fourth operation is larger than the operation amount of the third operation. In addition, the latch 237 and the latch 239 are an example of the "sampling unit" of the present invention.

Referring again to FIG. 4, as explained above, the signal RHRSLOT periodically reaches the logic level H only during a period including two clock pulses. In addition, the signal RHRSLOT is calculated in the refresh control unit 201. In particular, the period of the signal RHRSLOT depends on the temperature indicated in the temperature data TS. During the period when the logic level of the signal RHRSLOT is H, the signal RHR is generated as two consecutive pulses synchronized with the clock RFIP.

Before time t5, the logic levels of the priority switching signal RHR2nd and the distance switching signal PM2 are L and L. During the period from time t5 to time t6, the logic levels of the priority switching signal RHR2nd and the distance switching signal PM2 are H and L. During the period from time t6 to time t15, the logic levels of the priority switching signal RHR2nd and the distance switching signal PM2 are L and H. During the period from time t15 to time t16, the logic levels of the priority switching signal RHR2nd and the distance switching signal PM2 are H and H. Subsequently, similarly, the logic levels of the priority switching signal RHR2nd and the distance switching signal PM2 repeat (L, L), (H, L), (L, H), and (H, H) in principle.

However, for example, at time t16, the logic level of the distance switching signal PM2 does not change from L to H. In this case, the logic levels of the priority switching signal RHR2nd and the distance switching signal PM2 repeat (L, L) and (H, L) after (L, L) and (H, L). Similarly, although not shown in the figure, even in a timing sequence in which the logic level of the distance switching signal PM2 normally changes from H to L, the logic level of the distance switching signal PM2 may not change from H to L. In this case, the logic levels of the priority switching signal RHR2nd and the distance switching signal PM2 repeat (L, H) and (H, H) after (L, H) and (H, H). This part will be described in detail later.

The first sampling signal Sample is generated at times ts11, ts12, . . . , ts16. At these times, the seed address S1 of the A seed is refreshed. As shown in FIG. 4, the seed addresses S1 of the A seeds refreshed at times ts11, ts12, . . . , ts16 are set to S1(1), S1(2), . . . S1(6). The second sampling signal Sample2 is generated at times ts21 and ts22. During these times, the seed address S2 of the B seed is refreshed. As shown in FIG. 4, the seed address S2 of the B seed corresponding to the refresh at time ts21 and ts22 is set to S2(2) and S2(3). In addition, the seed address S2 of the B seed before time ts21 is set to S2(1).

At time ts11, the seed address S1 of the A seed is refreshed to S1(1) through the first sampling signal Sample. Since the logic level of the distance switching signal PM2 is L, the seed address of seed A is selected as the seed address Seed. In addition, since the logic level of the distance switching signal PM2 is L and the logic level of the priority switching signal RHR2nd is L, the prioritized adjacent RHA S1(1)±1 1st as the RHA is calculated by the first operation based on the seed address S1(1) of the A seed.

At time t5, the logic level of the priority switching signal RHR2nd changes from L to H, and changes from H to L at time t6. Therefore, the seed address S1(1) of A seed just before time t5 will continue to be maintained as the seed address Seed until time t6, and starting from time t5, the seed address S1(1) of A seed based on the second operation calculates the non-prioritized adjacent RHA S1(1)±1 2nd as the RHA.

Specifically, in the example of FIG. 4, the seed address S1(1) of the A seed is not refreshed from time t5 to t6; however, since the logic level of the priority switching signal RHR2nd has already changed from L to H at time t5, even if the seed address S1(1) of the A seed is refreshed during time t5 to t6, the seed address S1(1) of the A seed just before time t5 will be used as the seed address Seed is maintained until time t6.

Since the prioritized adjacent RHA S1(1)±1 1st is calculated by the first operation based on the same seed address S1(1) of the A seed, and the non-prioritized adjacent RHA S1(1)±1 2nd is calculated by the second operation, in which the operation amount of the second operation is larger than that of the first operation, a certain delay period is required until all the bits of the non-prioritized adjacent RHA S1(1) ±1 2nd are determined. However, the non-prioritized adjacent RHA S1(1)±1 2nd can be calculated synchronously with the pulse corresponding to the signal RHR.

At time t6, the logic level of the distance switching signal PM2 changes from L to H, and the logic level of the priority switching signal RHR2nd changes from H to L. Therefore, the seed address S2(1) of the B seed is selected as the seed address Seed. At the same time, based on the seed address S2(1) of the B seed, the prioritized further-adjacent RHA S2(1)±2 1st is calculated as the RHA through the third operation. This continues until time ts21. In addition, the seed address S2(1) of the B seed has been determined at time t1.

At time ts21, the seed address S2(1) of the B seed is refreshed to S2(2) through the second sampling signal Sample2. At this time, the logic level of the distance switching signal PM2 maintains H, and the logic level of the priority switching signal RHR2nd still maintains L. Therefore, the refreshed seed address S2(2) of the B seed is selected as the seed address Seed. At the same time, based on the seed address S2(2) of the B seed, the prioritized further-adjacent RHA S2(2)±2 1st is calculated as the RHA through the third operation.

At time t15, the logic level of the priority switching signal RHR2nd changes from L to H, and changes from H to L at time t16. Therefore, the seed address S2(2) of the B seed just before time t15 will maintain as the seed address Seed until time t16, and starting from time t15, based on the seed address S2(2) of the B seed, the non-prioritized further-adjacent RHA S2(2)±2 2nd is calculated as the RHA through the fourth operation.

Specifically, in the example of FIG. 4, the seed address S2(2) of the B seed is not refreshed during time t15 to t16; however, since the logic level of the priority switching signal RHR2nd has changed from L to H at time t15, even if the seed address S2(2) of the B seed is refreshed from time t15 to t16, the seed address S2(2) of the B seed just before time t15 will still be used as the seed address Seed and will be maintained until time t16.

Since the operation amount of the fourth operation is larger than that of the third operation, a delay period is required until all the bits of the non-prioritized further-adjacent RHA S2(2)±2 2nd are determined. However, the non-prioritized further-adjacent RHA S2(2)±2 2nd can be calculated synchronously with the pulse corresponding to the signal RHR.

At time t16, the logic level of the distance switching signal PM2 changes from H to L, and the logic level of the priority switching signal RHR2nd changes from H to L. Thus, the seed address S1(2) of the A seed is selected as the seed address Seed. At the same time, based on the seed address S1(2) of the A seed, the prioritized adjacent RHA S1(2)±1 1st is calculated as the RHA through the first operation. In addition, the seed address of the A seed has been refreshed to S1(2) through the first sampling signal Sample at time ts12.

At time ts13, the seed address S1(2) of the A seed is refreshed to the seed address S1(3) of the A seed through the first sampling signal Sample. Since the logic level of the distance switching signal PM2 is L and the logic level of the priority switching signal RHR2nd maintains L, the refreshed seed address S1(3) of the A seed is selected as the seed address Seed. At the same time, based on the refreshed seed address S1(3) of the A seed, the prioritized adjacent RHA S1(3)±1 1st is calculated as the RHA by the first operation.

Next, at time ts14, the seed address S1(3) of the A seed is refreshed to S1(4) through the first sampling signal Sample. At this time, since the logic level of the distance switching signal PM2 is L and the logic level of the priority switching signal RHR2nd maintains L, the refreshed seed address S1(4) of the A seed is selected as the seed address Seed. At the same time, based on the refreshed seed address S1(4) of the A seed, the prioritized adjacent RHA S1(4)±1 1st is calculated as the RHA by the first operation.

Next, at time ts15, the seed address S1(4) of the A seed is refreshed to S1(5) through the first sampling signal Sample. At this time, since the logic level of the distance switching signal PM2 is L and the logic level of the priority switching signal RHR2nd maintains L, the refreshed seed address S1(5) of the A seed is selected as the seed address Seed. At the same time, based on the refreshed seed address S1(5) of the A seed, the prioritized adjacent RHA S1(5)±1 1st is calculated as the RHA by the first operation.

Afterwards, at time t25, the logic level of the priority switching signal RHR2nd changes from L to H, and changes from H to L at time t26. Therefore, the seed address S1(5) of the A seed at the moment before time t25 will continue to be maintained as the seed address Seed until time t26, and starting from time t25, based on the seed address S1(5) of the A seed, the second operation calculates the non-prioritized adjacent RHA S1(5)±1 2nd as the RHA.

Specifically, in the example of FIG. 4, at time ts16 between time t25 and t26, the seed address S1(5) of the A seed is refreshed to S1(6) by the first sampling signal Sample, however, since the priority switching signal RHR2nd has changed from L to H at time t25, the non-prioritized adjacent RHA S1(5)±1 2nd will be calculated as the RHA by the second operation directly based on the original seed address S1(5) of the A seed.

Then at time t26, the logic level of the distance switching signal PM2 changes from L to H. In addition, the logic level of the priority switching signal RHR2nd still remains at L at this time. Therefore, the refreshed seed address S1(6) of the A seed is selected as the seed address Seed. At the same time, based on the seed address S1(6) of the A seed, the prioritized adjacent RHA S1(6)±1 1st is recalculated as the RHA by the first operation.

Although usually at time t26, the logic level of the distance switching signal PM2 will change from L to H, however, since the first sampling signal Sample is generated at time ts16 between time t25 and t26 (that is, the period that the logic level of the priority switching signal RHR2nd is H), the logic level of the distance switching signal PM2 is maintained at L, so that the calculation of the RHA is re-executed based on the newly sampled address.

Although it is not shown in the figure, there is an operation example in which the adjacent RHA and the further-adjacent RHA are replaced. At this time, the second sampling signal is generated at the timing of generating the first sampling signal, and the first sampling signal is generated at the timing of generating the second sampling signal. Therefore, the seed address S1 of the A seed and the seed address S2 of the B seed are replaced. In addition, the polarity of the distance switching signal PM2 is reversed. Then, the timing of the adjacent RHA S1(*i*)±1 is replaced by the timing of the further-adjacent RHA S2(*i*)±2, and the timing of the further-adjacent RHA S2(*j*)±2 is replaced by the timing of the adjacent RHA S1(*j*)±1.

Figure 5:
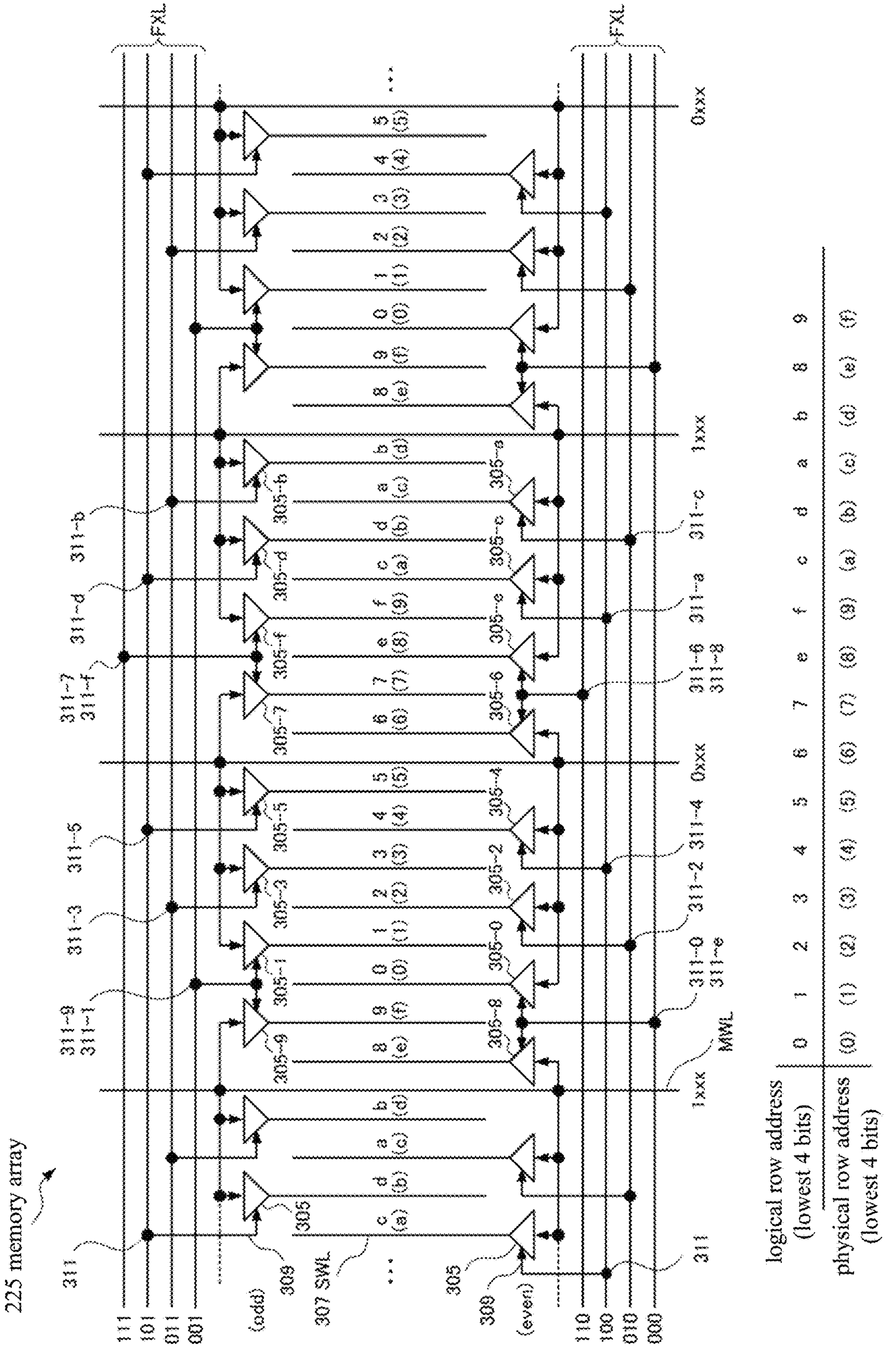
FIG. 5 is a schematic diagram showing the configuration patterns corresponding to parts of 16 row straight lines of a memory array in the semiconductor memory device.

FIG. 5 shows the arrangement pattern of the portion corresponding to the 16 row straight lines in the memory array 225. This configuration pattern is repeated in the memory array 225. In the memory array 225, the eight selection lines FXL corresponding to the decoding results of the lowest 3 bits of the row address and a plurality of selection lines MWL corresponding to the decoding results of the higher bits of the row address are wired.

The sub-word driver 305 selected by both the activated selection line MWL and FXL is activated, and the row straight line SWL connected thereto is activated. The sub-word drivers 305 arranged on the lower side of the row straight line is arranged for every two rows, and the sub-word drivers 305 arranged on the upper side of the straight line are arranged for every two columns. These are arranged interleavedly on row straight lines.

Four of the eight selection lines FXL are arranged on the lower side of the lower sub-word driver 305, and the remaining four selection lines FXL are arranged on the upper side of the upper sub-word driver 305. The four selection lines FXL on the lower side are arranged in the order of the last 4 digits of the logical row address, which are 000, 010, 100, and 110 from back to front. In addition, the four selection lines FXL on the upper side are arranged in the order of the last 4 digits of the logical row address, which are 001, 011, 101, and 111 from back to front. Therefore, four selection lines FXL corresponding to the even number logical row addresses are arranged on the lower side, and four selection lines FXL corresponding to the odd number logical row addresses are arranged on the upper side.

For the four lower-side selection lines FXL, the selection lines FXL and the wiring 309 are arranged so that the nodes 311 of the wiring 309 connecting each selection line FXL and each sub-word driver 305 form a zigzag pattern every 8 sub-word driver 305. Similarly, for the four upper-side selection lines FXL, the selection lines FXL and the wiring 309 are arranged so that the nodes 311 of the wiring 309 connecting each selection line FXL and each sub-word driver 305 form a zigzag pattern every 8 sub-word driver 305.

The nodes 311-0 to **311-*f* corresponding to the last 4 digits of the row address expressed in binary digits, with values from 0 to f, are arranged at positions as shown in FIG. 5. The sub-word drivers 305-0 to 305-*f* corresponding to the last 4 digits of the row address expressed in binary digits, with values from 0 to f, are arranged at positions as shown in FIG. 5. Each sub-word driver 305 is connected to the selection line FXL via the node 311 and the wiring 309. Therefore, when the remainder of dividing a row address by 16 is expressed as hexadecimal numbers from 0 to f, the word lines allocated from the row address with a remainder of 0 to the row address with a remainder of f are arranged as shown in FIG. 5. That is, when presented as the remainder of the row address assigned to the word line divided by 16 (when presented as the hexadecimal number corresponding to the lowest 4 bits of the row address), the word lines in the memory array 225** are arranged in the order of "0, 1, 2, 3, 4, 5, 6, 7, e, f, c, d, a, b, 8, 9"

Therefore, the order assigned to the word lines according to the order of the word lines arranged in the memory array 225 is called a physical row address. In addition, if the row address XADD2 input by the row decoder and memory bank logic unit 207, which is simply referred to as the row address, is called a logical row address, the corresponding relationship between the lowest 4 bits of the physical row address and the lowest 4 bits of the logical row address is also as shown in FIG. 5.

The row straight lines SWL in the memory array 255 are arranged in the order of physical row addresses. Therefore, any two selected row straight lines SWL are separated from each other only by a distance corresponding to the difference between the two physical row addresses corresponding to the any two selected row straight lines SWL.

Furthermore, referring to FIG. 5, the physical addresses (0), (1), (2), (3), (4), (5), (6), (7), (e), (f), (c), (d), (a), (b), (8), and (9) are assigned to the word lines to which the logical row addresses 0, 1, 2, 3, 4, 5, 6, 7, 8, 9, a, b, c, d, e, and f are assigned, respectively.

In addition, when referring in reverse, the logical row addresses 0, 1, 2, 3, 4, 5, 6, 7, e, f, c, d, a, b, 8, and 9 are assigned to the word lines to which the physical addresses (0), (1), (2), (3), (4), (5), (6), (7), (8), (9), (a), (b), (c), (d), (e), and (f) are assigned, respectively.

Therefore, if the logical row address 2 is selected as the seed address of the A seed (the logical seed address of the A seed), the corresponding physical address (physical seed address) is (2), and the logical row addresses of the adjacent RHA are 1 and 3, and the physical addresses corresponding to the adjacent RHA are (1) and (3) adjacent to (2). Further, if the logical row address b is selected as the seed address of the A seed (the logical seed address of the A seed), the corresponding physical address (physical seed address) is (d). Next, the physical addresses (physical RHA) corresponding to the adjacent RHA (logical adjacent RHA) are (c) and (8) adjacent to (d), and the adjacent RHA (logical adjacent RHA) is a and 8. Further, if the logical row address 2 is selected as the seed address of the B seed (the logical seed address of the B seed), the corresponding physical address (physical seed address) is (2). Next, the physical address (physical RHA) corresponding to the further-adjacent RHA (logical further-adjacent RHA) is (0) and (4) that are further adjacent to (2), and the further-adjacent RHA (logical further-adjacent RHA) is 0 and 4.

FIG. 6 is a schematic diagram showing the corresponding relationship between the seed address and the row hammer refresh address. The left side shows the corresponding relationship between the seed address of the A seed and the adjacent RHA, and the right side shows the corresponding relationship between the seed address of the B seed and the further-adjacent RHA. In addition, in FIG. 6, only the lowest 4 bits are shown.

Referring to the left side of FIG. 6, only the lowest bit of the logical seed address 2 of the A seed is inverted from 0 to 1, and the logical-adjacent RHA 3 can be calculated. In addition, by inverting only the lowest bit of the logical seed address 7 of the A seed is inverted from 1 to 0, and the logical adjacent RHA 6 can be calculated. Furthermore, by inverting only the lowest bit of the logical seed address b of the A seed from 1 to 0, the logical adjacent RHA a can be calculated. This operation corresponds to the first operation.

However, the logical adjacent RHA 8 cannot be calculated by simply inverting the lowest bit of the logical seed address b of the A seed. In order to calculate the logical adjacent RHA 8 from the logical seed address b of the A seed, in addition to inverting the lowest bit from 1 to 0, it is necessary to invert the second lowest bit from 1 to 0. For this purpose, a somewhat complicated calculation such as carry processing is required. This operation corresponds to the second operation.

Therefore, the prioritized adjacent RHA of the logical seed address b corresponding to the A seed is a, and the non-prioritized adjacent RHA is 8.

Referring to the right side of FIG. 6, only the second lowest bit of the logical seed address 2 of the B seed is inverted from 1 to 0, and the logical further-adjacent RHA 0 can be calculated. In addition, by inverting only the second lowest bit of the logical seed address e of the B seed from 1 to 0, the logical further-adjacent RHA c can be calculated. Further, by inverting only the second lowest bit of the logical seed address b of the B seed from 1 to 0, the logical further-adjacent RHA 9 can be calculated. This operation corresponds to the third operation.

However, the logical further-adjacent RHA d cannot be calculated from the logical seed address b by simply inverting the second lowest bit of the logical seed address b of the B seed. In order to calculate the logical further-adjacent RHA d from the logical seed address b of the B seed, in addition to inverting the second lowest bit from 1 to 0, it is necessary to invert the third lowest bit from 0 to 1. For this purpose, a complicated calculation such as carry processing is required. This operation corresponds to the fourth operation.

Therefore, the prioritized further-adjacent RHA of the logical seed address b corresponding to the B seed is 9, and the non-prioritized further-adjacent RHA is d.

By adding 1 or subtracting 1 to the physical seed address corresponding to the logical seed address of the A seed, the physical RHA corresponding to the logical RHA of the A seed can be obtained. Therefore, in order to obtain the logical adjacent address from the logical seed address of the A seed, for example, the following steps may be performed: (SA1) Obtaining the physical seed address from the logical seed address of the A seed (perform forward conversion). (SA2) Obtaining the physical adjacent RHA by adding or subtracting 1 to the physical seed address (shift the physical address). (SA3) Obtaining the logical adjacent RHA from physical adjacent RHA (perform reverse conversion).

Similarly, by adding or subtracting 2 to the physical seed address corresponding to the logical seed address of the B seed, the physical RHA corresponding to the logical RHA of the B seed can be obtained. Therefore, in order to obtain the logical further-adjacent address from the logical seed address of the B seed, for example, the following steps can be performed: (SB1) Obtaining the physical seed address from the logical seed address of the B seed (perform forward conversion). (SB2) Obtaining the physical further-adjacent RHA by adding or subtracting 2 to the physical seed address (shift the physical address). (SB3) Obtaining the logical further-adjacent RHA from the physical further-adjacent RHA (perform reverse conversion).

Here, in order to obtain the physical seed address from the logical seed address through forward conversion, in addition to referring to the correspondence table between the two, for example, we can also perform the following bit operations.

Logical seed address:

(Ain<n:3+1>, Ain<3>, Ain<2>, Ain<1>, Ain<0>)

Physical seed address:

(APin<n:3+1>, APin<3>, APin<2>, APin<1>, APin<0>)

Operation:

APin<0>=Ain<0>; APin<1>=Ain<1>^ Ain<3>;
APin<2>=Ain<2>^ Ain<3>; APin<3>=Ain<3>;
APin<n:3+1>=Ain<n:3+1> wherein the operator ^ indicates logical XOR operations.

Similarly, in order to obtain the logical adjacent RHA from the physical adjacent RHA through reverse conversion, in addition to referring to the correspondence table between the two, for example, we can also perform the following bit operations.

Physical RHA:

(APout<n:3+1>, APout<3>, APout<2>, APout<1>, APout<0>)

Logical RHA:

(Aout<n:3+1>, Aout<3>, Aout<2>, Aout<1>, Aout<0>)

Operation:

Aout<0>=APout<0>; Aout<1>=APout<1>^APout<3>;
Aout<2>=APout<2>^APout<3>; Aout<3>=APout<3>;
Aout<n:3+1>=APout<n:3+1> wherein the operator ^ indicates logical XOR operations. The same operation can be used when obtaining the logical further-adjacent RHA from the physical further-adjacent RHA.

Figure 7:
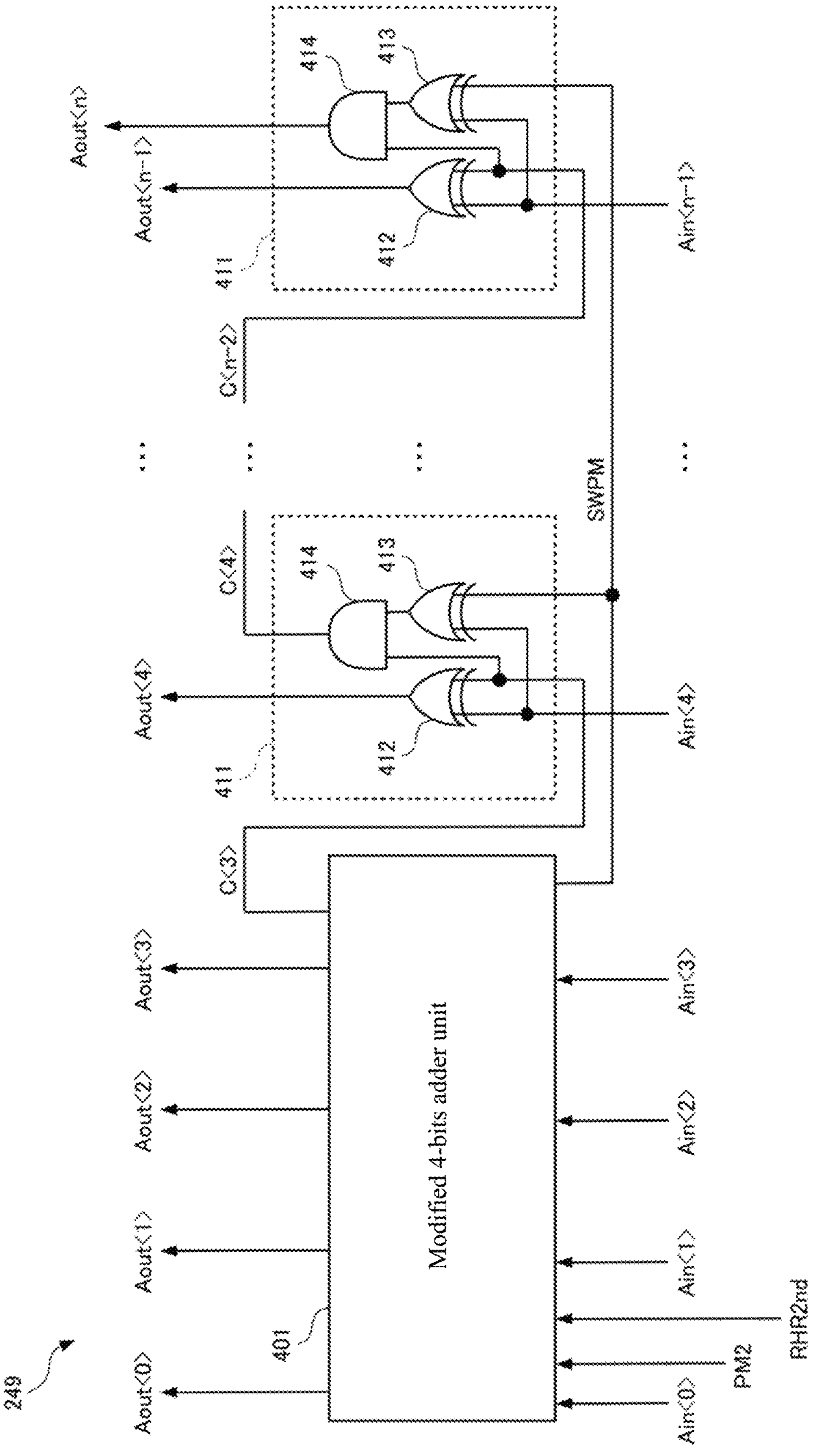
FIG. 7 is a circuit diagram showing an example structure of the calculation unit shown in FIG. 3.

FIG. 7 is a circuit diagram showing the structure of the calculation unit 249 shown in FIG. 3. As described above, the calculation unit 249 calculates and outputs four types of RHA based on the seed address Seed according to the combination of the distance switching signal PM2 and the priority switching signal RHR2nd.

The calculation unit 249 includes a modified 4-bit adder unit 401, which calculates the lowest 4 bits Aout<3:0> of the RHA, carry C<3>, and positive and negative switching signal SWPM based on the lowest 4 bits Ain<3:0> of the seed address, the distance switching signal PM2, and the priority switching signal RHR2nd. In addition, the calculation part 249 further includes m half adders 411, using the lowest 4 bits of the seed address, the part Ain<n−1:4> that is based on the higher bits, the carry C<3>, and the positive and negative switching signal SWPM, the part Aout<n:4> that is higher than the lowest 4 bits of RHA is calculated. Here, assuming that the number of bits constituting the RHA is n, m is n−4.

The modified 4-bit adder unit 401 calculates the lowest 4 bits Aout<3:0>, carry C<3>, and the positive and negative switching signal SWPM of the logical RHA (i.e., RHA) corresponding to the lowest 4 bits Ain<3:0> of the logical seed address Seed while referring to the distance switching signal PM2 and the priority switching signal RHR2nd. The structure of the modified 4-bit adder unit 401 will be described later.

As mentioned above, the distance switching signal PM2 is a signal used to specify the calculation of adjacent RHA or the calculation of further-adjacent RHA. In addition, the priority switching signal RHR2nd is a signal used to specify whether to calculate a prioritized RHA (prioritized adjacent RHA or prioritized further-adjacent RHA) or to calculate a non-prioritized RHA (non-prioritized adjacent RHA or non-prioritized further-adjacent RHA) for the same seed address. The positive and negative switching signal SWPM is a signal used to specify whether to calculate the RHA on the upper side or to calculate the RHA on the lower side for the same seed address in the order of physical addresses.

The half adder 411 includes logical XOR gates 412, 413 and an AND gate 414. The half adder 411 is also provided for each bit in the modified 4-bit adder unit 401 (see FIG. 10). Among them, the logical XOR gate 412 performs the logical XOR operations of the bit Ain<i> (here, i=4~n−1) corresponding to the input address and the carry input C<i−1> from the lower bits, and outputs the result as Aout<i> of the output address. In addition, the logical XOR gate 413 performs the logical XOR operations of the bit Ain<i> (here, i=4~n−1) corresponding to the input address and the positive and negative switching signal SWPM. Furthermore, the AND gate 414 outputs the result of the carry input C<i−1> from the low bit and the logical XOR operation of the logical XOR gate 412 as the carry output C<i>.

The positive and negative switching signal SWPM is calculated inside the modified 4-bit adder unit 401 as described below.

Referring to FIG. 9, when the distance switching signal PM2 is L, the logic level of the positive and negative switching signal SWPM is determined by the combination of the logic level of the priority switching signal RHR2nd and the bit Ain<0>. Among them, when the priority switching signal RHR2nd is L, the logic level of bit Ain<0> directly becomes the logic level of the positive and negative switching signal SWPM; when the priority switching signal RHR2nd is H, the logic level of bit Ain<0> is inverted to become the logic level of the positive and negative switching signal SWPM.

Thus, when the adjacent RHA is designated (PM2=L) and the prioritized RHA is designated (RHR2nd=L), specifying the operation of adding 1 (i.e., operation of +1) if the lowest bit Ain<0> of the seed address is L, and specifying the operation of subtracting 1 (i.e., operation of −1) if the lowest bit Ain<0> of the seed address is H; on the other hand, when the adjacent RHA is specified (PM2=L) and the non-prioritized RHA is specified (RHR2nd=H), specifying the operation of subtracting 1 (i.e., operation of −1) if the lowest bit Ain<0> of the seed address is L, and specifying the operation of adding 1 (i.e., operation of +1) if the lowest bit Ain<0> of the seed address is H.

Here, the "operation of −1" is used to perform the operations of the calculation of the RHA (upper-side adjacent RHA) allocated to the wiring that is only 1 unit away from the upper side with respect to the wiring to which the seed address of the A seed is allocated in the order of the physical addresses. In addition, the "operation of +1" is used to perform the operations of the calculation of the RHA (lower-side adjacent RHA) allocated to the wiring that is 1 unit away from the lower side with respect to the wiring to which the seed address of the A seed is allocated in the order of the physical addresses.

Referring again to FIG. 9. When the distance switching signal PM2 is H, through the combination of the priority switching signal RHR2nd and the logical XOR operation result of the bit Ain<1> and the bit Ain<3>, determine the positive and negative switching signal SWPM. When the priority switching signal RHR2nd is L, the logic level of the logical XOR operation result of bit Ain<1> and bit Ain<3> directly becomes the logic level of the positive and negative switching signal SWPM; when the switching signal RHR2nd is H, the logic level of the logical XOR operation result of bit Ain<1> and bit Ain<3> is inverted to become the logic level of the positive and negative switching signal SWPM.

In addition, the result of the logical XOR operation of the bits Ain<1> and Ain<3> of the seed address corresponds to the bit APin<1> of the physical seed address.

Thus, when the further-adjacent RHA is designated (PM2=H) and the prioritized RHA is designated (RHR2nd=L), specifying an operation of adding 2 (i.e., operation of +2) if the logical XOR operation result of the bits Ain<1> and Ain<3> of the seed address is L, and specifying an operation of subtracting 2 (i.e., operation of −2) if the logical XOR operation result of the bits Ain<1> and Ain<3> of the seed address is H; on the other hand, when the further-adjacent RHA is specified (PM2=L) and the non-prioritized RHA is specified (RHR2nd=H), specifying the operation of subtracting 2 if the result of the logical XOR operation of the bits Ain<1> and Ain<3> of the seed address is L, and specifying the operation of adding 2 if the logical XOR operation result of the bits Ain<1> and Ain<3> of the seed address is H.

Here, the "operation of −2" is used to perform the operation of the calculation of the RHA (upper-side adjacent RHA) allocated to the wiring that is only 2 units away from the upper side with respect to the wiring to which the seed address of the B seed is allocated in the order of physical addresses. In addition, the "operation of +2" is used to perform the operation of the calculation of the RHA (lower-side adjacent RHA) allocated to the wiring that is only 2 units away from the lower side with respect to the wiring to which the seed address of the B seed is allocated in the order of physical addresses.

Here, the seed address of the A seed, the upper-side adjacent RHA, the lower-side adjacent RHA, the prioritized adjacent RHA, and the non-prioritized adjacent RHA are summarized as shown in FIG. 8A. In addition, the seed address of the B seed, the upper-side adjacent RHA, the lower-side adjacent RHA, the prioritized adjacent RHA, and the non-prioritized adjacent RHA are summarized as shown in FIG. 8B. The corresponding relationship between the physical address and the logical address is shown in FIG. 8C. Here, although the addresses shown in the tables of FIGS. 8A and 8B are all logical addresses, the corresponding physical addresses can be obtained by referring to FIG. 8C.

In order to obtain the upper-side adjacent RHA corresponding to the logical address of the A seed, the physical address of the A seed can be obtained from the logical address of the A seed by referring to the table in FIG. 8C, and then obtains the physical address only 1 unit lesser than the physical address of the A seed as the physical upper-side adjacent RHA. Then, the logical address corresponding to the physical upper-side adjacent RHA is the upper-side adjacent RHA.

In order to obtain the lower-side adjacent RHA corresponding to the logical address of A seed, the physical address of A seed can be obtained from the logical address of A seed by referring to the table in FIG. 8C, and then obtains the physical address that is only 1 unit greater than the physical address of the A seed as the physical lower-side adjacent RHA. Then, the logical address corresponding to the physical lower-side adjacent RHA is the lower-side adjacent RHA.

In order to obtain the upper-side further-adjacent RHA corresponding to the logical address of the B seed, the physical address of the B seed can be obtained from the logical address of the B seed by referring to the table in FIG. 8C, and then obtains the physical address only 2 units lesser than the physical address of the B seed as the physical upper-side further-adjacent RHA. Then, the logical address corresponding to the physical upper-side further-adjacent RHA is the upper-side further-adjacent RHA.

In order to obtain the lower-side further-adjacent RHA corresponding to the logical address of B seed, the physical address of B seed can be obtained from the logical address of B seed by referring to the table in FIG. 8C, and then obtains the physical address that is 2 units greater than the physical address of the B seed as the physical lower-side further-adjacent RHA. Then, the logical address corresponding to the physical lower-side further-adjacent RHA is the lower-side further-adjacent RHA.

Figure 10:
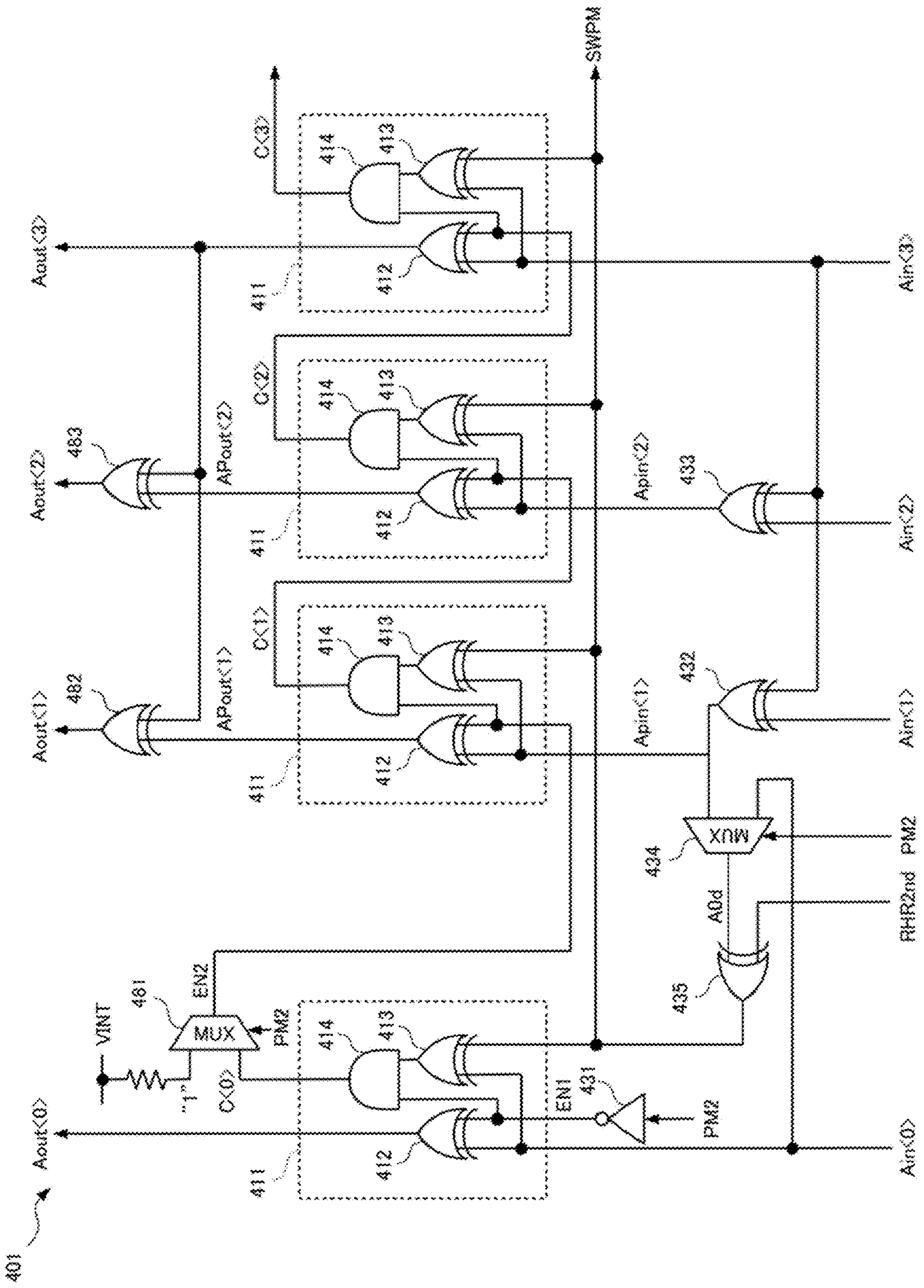
FIG. 10 is a circuit diagram showing an example structure of the modified 4-bits adder unit shown in FIG. 7.

FIG. 10 is a circuit diagram showing a configuration example of the modified 4-bit adder unit 401 shown in FIG. 7. As mentioned above, the modified 4-bit adder unit 401 includes four half adders 411, which respectively corresponds to each of the bits of Ain<3:0> of the calculated RHA.

Please refer to FIG. 10. In order to convert the seed address Seed into a physical seed address, the modified 4-bit adder unit 401 includes a logical XOR gate 432 corresponding to the bit Ain<1> of the seed address Seed, and a logical XOR gate 433 corresponding to the bit Ain<2> of the seed address Seed. The logical XOR gate 432 outputs the result of the logical XOR operation between bits Ain<1> and bit Ain<3> of the seed address Seed as bit APin<1> of the physical seed address. Similarly, the logical XOR gate 433 outputs the result of the logical XOR operation of bits Ain<2> and bit Ain<3> of the seed address Seed as bit APin<2> of the physical seed address.

In addition, the bits APin<n−1:3> and APin<0> of the physical seed address are the same as the bits Ain<n−1:3> and Ain<0> of the seed address.

Here, the logical XOR gates 432 and 433 constitute the key to the conversion unit (corresponding to the "forward address conversion unit" of the present invention) from the seed address Seed to the physical seed address.

Please refer again to FIG. 10. In order to reversely convert the physical RHA into RHA, the modified 4-bit adder unit 401 further includes a logical XOR gate 482 corresponding to the bit Aout<1> of RHA, and a logical XOR gate 483 corresponding to the bit Aout<2> of RHA. The logical XOR gate 482 outputs the result of the logical XOR operation of the bit APout<1> and the bit APout<3> of the physical RHA as the bit Aout<1> of the RHA. The logical XOR gate 483 outputs the result of the logical XOR operation of the bit APout<2> and the bit APout<3> of the physical RHA as the bit Aout<2> of the RHA.

In addition, the bits Aout<n−1:3> and Aout<0> of the RHA are the same as the bits APout<n−1:3> and APout<0> of the physical RHA.

The logical XOR gates 482 and 483 constitute the key to the conversion unit (corresponding to the "reverse address conversion unit") from the physical RHA to the RHA.

Furthermore, the modified 4-bit adder unit 401 includes an inverter 431, which calculates the signal EN1 for the inversion of the distance switching signal PM2.

Furthermore, the modified 4-bit adder unit 401 includes a multiplexer 434 and a logical XOR gate 435. Logical XOR gates 432, 435 and multiplexer 434 are used to calculate the positive and negative switching signal SWPM through the combination of signals described with reference to FIG. 9.

Furthermore, the modified 4-bit adder unit 401 includes a multiplexer 481. The multiplexer 481 is controlled by the distance switching signal PM2 and outputs the signal from the corresponding logic level H or the carry output C<0> of the half adder 411 of the lowest bit as signal EN2. Here, the half adder 411 corresponding to the lowest bit<0> to the half adder 411 corresponding to the highest bit <n−1> and the multiplexer 481 correspond to the "physical address shift unit" of the present invention.

Next, the operations will be described. The logic level of the distance switching signal PM2 is L, whereby when calculating the adjacent RHA based on the seed address of the A seed, the signal EN1 with the logic level H is input to the carry input terminal (i.e., the common input terminal of the logical XOR gate 412 and the AND gate 414) of the half adder 411 corresponding to the lowest bit. Therefore, the inverse of the logic level of the bit Ain<0> of the first seed address becomes the logic level of the bit Aout<0> of the RHA.

In addition, the logic level of the distance switching signal PM2 is L, whereby the adjacent RHA is calculated at the seed address specified based on the A seed, and the logic level of the priority switching signal RHR2nd is L, whereby when the prioritized adjacent RHA of the two adjacent RHAs is specified to be calculated, the positive and negative switching signal SWPM becomes the logic level of Ain<0> through the multiplexer 434 and the logical XOR gate 435. At this point, the RHA is calculated as follows.

If the bit Ain<0> of the seed address of A seed is L, the positive and negative switching signal SWPM becomes L, and the lower-side adjacent (+1) RHA of the two adjacent RHAs is calculated as the prioritized adjacent RHA. On the other hand, if the bit Ain<0> of the seed address of A seed is H, the positive and negative switching signal SWPM becomes H, and the upper-side adjacent (−1) RHA of the two adjacent RHAs is calculated as the prioritized adjacent RHA. In these cases, the only operation required is to invert the lowest bit Ain<0>. In any half adder 411 included in the calculation unit 249, no carry process is required. However, operations are performed in logical XOR gates 432, 433, 482, and 483.

In addition, the logic level of the distance switching signal PM2 is L, whereby the adjacent RHA is calculated at the seed address specified based on the A seed, and the logic level of the priority switching signal RHR2nd is H, whereby when the non-prioritized adjacent RHA of the two adjacent RHAs is specified to be calculated, the positive and negative switching signal SWPM becomes the logic level of the inverted Ain<0> through the multiplexer 434 and the logical XOR gate 435. At this point, the RHA is calculated as follows.

If the bit Ain<0> of the seed address of A seed is L, the positive and negative switching signal SWPM becomes H, and the upper-side adjacent (−1) RHA of the two adjacent RHAs is calculated as the non-prioritized adjacent RHA. On the other hand, if the bit Ain<0> of the seed address of A seed is H, and the positive and negative switching signal SWPM becomes L, the lower-side adjacent (+1) RHA of the two adjacent RHAs is calculated as the non-prioritized adjacent RHA. In these cases, the operations required is not just the operation of inverting the lowest bit Ain<0>. At least part of the half adder 411 included in the calculation unit 249 needs to include a carry process. In addition, the operations are also performed in logical XOR gates 432, 433, 482, and 483.

In addition, the logic level of the distance switching signal PM2 is H, whereby the further-adjacent RHA is calculated at the seed address specified based on the B seed, and the logic level of the priority switching signal RHR2nd is L, whereby when specifying the prioritized further-adjacency RHA of the two further-adjacency RHAs, through the multiplexer 434 and the logical OR gate 435, the positive and negative switching signal SWPM becomes the logic level of logical XOR between Ain<1> and Ain<3> (that is, the logic level of the second lowest bit APin<1> of the physical address corresponding to the physical address of the seed address of B seed). At this point, the RHA is calculated as follows.

If the logical XOR operation result of the bits Ain<1> and Ain<3> of the seed address of B seed (that is, the second lowest bit APin<1> of the physical address corresponding to the physical address of the seed address of B seed) is L, the positive and negative switching signal SWPM becomes L, and the lower-side further-adjacent (+2) RHA of the two further-adjacent RHAs is calculated as the prioritized further-adjacent RHA. On the other hand, if the logical XOR operation result of the bits Ain<1> and Ain<3> of the seed address of B seed is H, the positive and negative switching signal SWPM becomes H, and the upper-side further-adjacent (−2) RHA of the two further-adjacent RHAs is calculated as the prioritized further-adjacent RHA. In these cases, the only operation required is to invert the second lowest bit APin<1> of the seed address of B-seed. In any half adder 411 included in the calculation section 249, carry process is also not required. However, the operations are performed in logical XOR gates 432, 433, 482, and 483.

In addition, the logic level of the distance switching signal PM2 is H, whereby the further-adjacent RHA is calculated at the seed address specified based on the B seed, and the logic level of the priority switching signal RHR2nd is H, whereby when the non-prioritized further-adjacent RHA of the two further-adjacent RHAs is specified to be calculated, through the multiplexer 434 and the logical XOR gate 435, the positive and negative switching signal SWPM becomes the logic level of the logical XOR between the inverted Ain<1> and Ain<3> (that is, inverting the logic level of the second lowest bit APin<1> of the physical address corresponding to the physical address of the seed address of B seed). At this point, the RHA is calculated as follows.

If the logical XOR operation result of the bits Ain<1> and Ain<3> of the seed address of B seed (that is, the second lowest bit APin<1> of the physical address corresponding to the physical address of the seed address of B seed) is L, the positive and negative switching signal SWPM becomes H, and the upper-side further-adjacent (−2) RHA of the two further-adjacent RHAs is calculated as the non-prioritized further-adjacent RHA. On the other hand, if the logical XOR operation result of Ain<1> and Ain<3> of the seed address of B seed (that is, the physical address of the physical address corresponding to the seed address of B seed) is H, the positive and negative switching signal SWPM becomes L, and the lower-side further-adjacent (+2) RHA of the two further-adjacent RHAs is calculated as the prioritized further-adjacent RHA. In these cases, the operations required is not just the operation of inverting the second lowest bit APin<1> of the seed address of B-seed. At least part of the half adder 411 included in the calculation unit 249 needs to include a carry process. In addition, operations are also performed in logical XOR gates 432, 433, 482, and 483.

Here, although the description is partially repeated, referring to FIG. 4, during the period when the logic levels of the priority switching signal RHR2nd and the distance switching signal PM2 is L, it becomes possible to refresh the adjacent RHA of the A seed by only inverting the lowest bit of the seed address S1 of the A seed just after the seed address S1 was refreshed by the first sampling signal Sample. This is because one of the two adjacent RHAs (the upper-side adjacent RHA and the lower-side adjacent RHA) is selected as the prioritized adjacent RHA by the above-mentioned logic.

While the logic level of the distance switching signal PM2 is maintained at L, if the logic level of the priority switching signal RHR2nd changes from L to H, the prioritized adjacent RHA is switched to the non-prioritized adjacent RHA simultaneously..

In addition, during the period when the logic level of the distance switching signal PM2 is L and the logic level of the priority switching signal RHR2nd is H, even if the seed address S1 of the A seed is refreshed by the first sampling signal Sample, the refresh of the RHA during this period can be avoid since the seed address Seed provided to the calculation unit 249 is latched by the latch 241 controlled by the priority switching signal RHR2nd. That is, during the period when the logic level of the distance switching signal PM2 is L and the logic level of the priority switching signal RHR2nd is H, refreshing the RHA through a process including a carry process can be avoided based on the new seed address.

During the period when the logic level of the priority switching signal RHR2nd is L and the logic level of the distance switching signal PM2 is H, it becomes possible to refresh the physical address corresponding to the RHA by inverting only the second lowest bit of the physical address (when viewed through a set of half adders 411) corresponding to the seed address S2 of the B seed just after the seed address S2 of the B seed is refreshed by the second sampling signal Sample2. This is because one of the two further-adjacent RHAs (the upper-side further-adjacent RHA and the lower-side further-adjacent RHA) is selected as the prioritized further-adjacent RHA by the above-mentioned logic.

While the logic level of the distance switching signal PM2 is maintained at H, if the logic level of the priority switching signal RHR2nd changes from L to H, the prioritized further-adjacent RHA is switched to the non-prioritized further-adjacent RHA synchronously.

In addition, during the period when the logic level of the distance switching signal PM2 is H and the logic level of the priority switching signal RHR2nd is H, even if the seed address S2 of the B seed is refreshed by the second sampling signal Sample2, since the seed address Seed provided to the calculation part 249 is latched by the latch 241 controlled by the priority switching signal RHR2nd, the refresh of the RHA during this period can be avoided. That is, during the period when the logic level of the distance switching signal PM2 is H and the logic level of the priority switching signal RHR2nd is H, it is possible to avoid refreshing the RHA by a process including a carry process based on the new seed address.

The second embodiment of the present invention will be described below. The basic structure of the second embodiment is the same as that of the first embodiment, so repeated descriptions will be omitted. Compared with the first embodiment, the second embodiment differs in the structure of the modified 4-bit adder unit 401 included in the calculation unit 249. In addition, in the second embodiment, the modified 4-bit adder unit 401 performs calculation based on the truth table shown in FIG. 11.

If the lowest 4 bits of the seed address (logical seed address) are presented as A<3:0>, the lowest 4 bits of the RHA (logical RHA) are represented by B<3:0>, and the carry output from the third lowest bit inside the calculation unit 249 is represented by C3. The bits B3-B0 contained in the lowest 4 bits B<3:0> of the RHA and the carry output C3 can be calculated based on each bit A3~A0 included in the lowest 4 bits A<3:0> of the seed address by operation 1 to operation 4 with the following logical expression.

(Operation 1) Prioritized adjacent RHA (PM2=L, RHR2nd=L)

B0=!A0; B1=A1; B2=A2; B3=A3; C3=0;

(Operation 2) Non-prioritized adjacent RHA (PM2=L, RHR2nd=H)

B0=!A0; B1=A1 {(A0^A1 ^A3)|(A1 ^A2)};

B2=A2^{(A0 ^A1 ^A3)|(A1 ^A2)};

B3=A3^!{(A0^A1 ^A3)|(A1^A2)}; C3=(!A0^A3) & (A1| A2);

(Operation 3) Prioritized further-adjacent RHA (PM2=H, RHR2nd=L)

B0=A0; B1=!A1; B2=A2; B3=A3; C3=0;

(Operation 4) Non-prioritized further-adjacent RHA (PM2=H, RHR2nd=H)

B0=A0; B1=A2; B2=A1; B3=A3^!(A1 ^A2); C3=!(A1| A2);

Wherein

!: NOT

|: OR

&: AND

^: OR

Here, in addition to the equation related to bit B0, by replacing A0 contained in the equation corresponding to the non-prioritized adjacent RHA with A1^A3, the equation corresponding to the non-prioritized further-adjacent RHA can be obtained.

Figure 12:
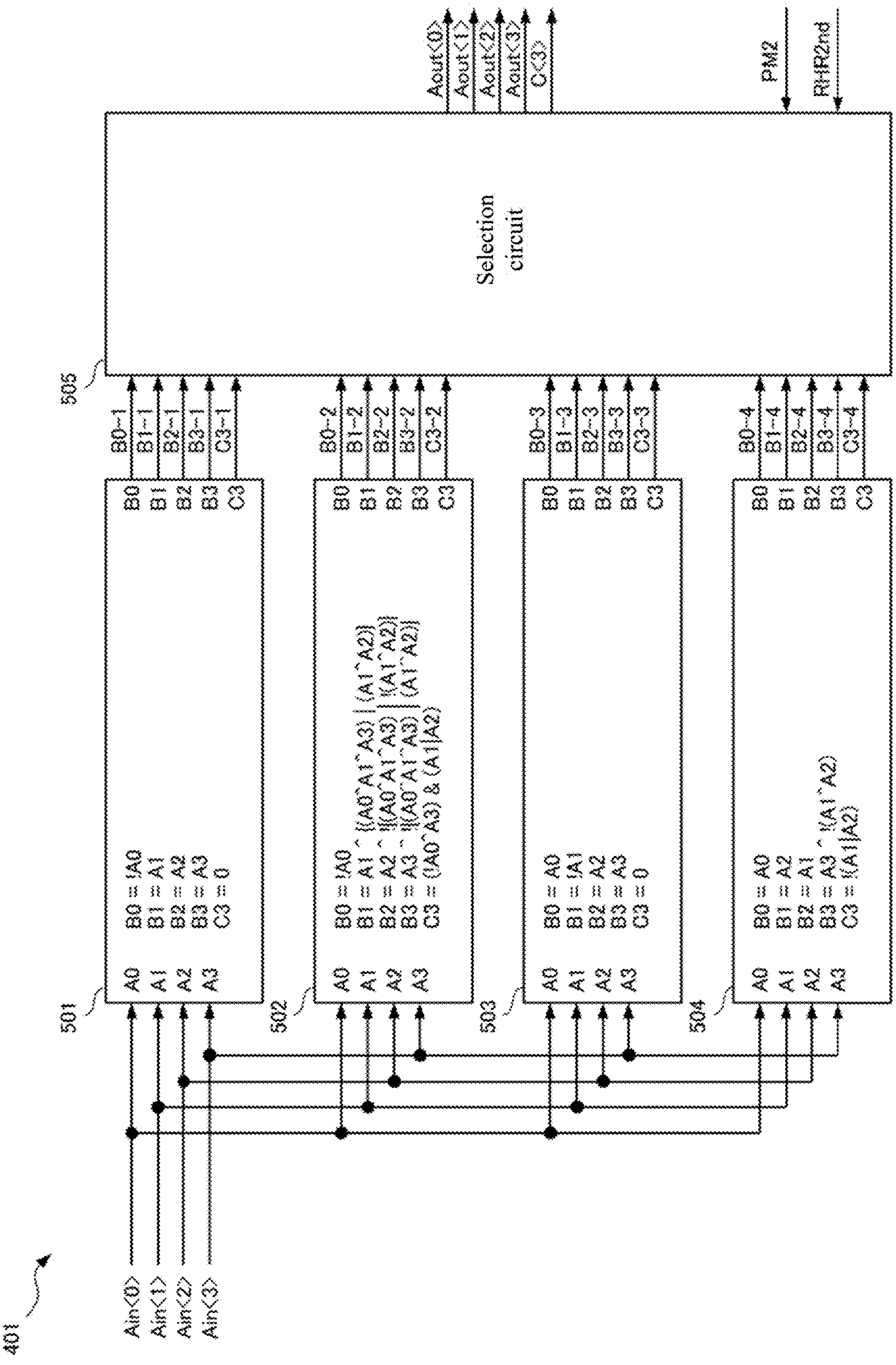
FIG. 12 is a circuit diagram showing the structure of the RHA calculation unit according to the second embodiment of the present invention.

In order to perform the above calculation, a modified 4-bit adder unit 401 as shown in FIG. 12 is used. The modified 4-bit adder unit 401 includes an operation unit 501 corresponding to the above operation (1), an operation unit 502 corresponding to the above operation (2), an operation unit 503 corresponding to the above operation (3), an operation unit 504 corresponding to the above operation (4), and a selection circuit 505 configured to select the output signals from the operation units 501, 502, 503, and 504 as its output according to the distance switching signal PM2 and the priority switching signal RHR2nd.

The basic structure of the third embodiment is the same as that of the first embodiment, thus the repeated descriptions are omitted. Compared with the first embodiment, in the third embodiment, the structure of the modified 4-bit adder unit 401 included in the calculation unit 249 is different. In addition, in the second embodiment, the selection circuit 505 is operated as a functional block. On the other hand, in the third embodiment, after the logic circuit inside the selection circuit 505 is realized, the logic circuits related to the bits B0 to B3 of the RHA and the carry CO are integrated into one circuitry. That is, in the third embodiment, the logic circuits included in the calculation units 501 to 504 and the selection circuit 505 are integrated into one circuitry.

Figure 13:
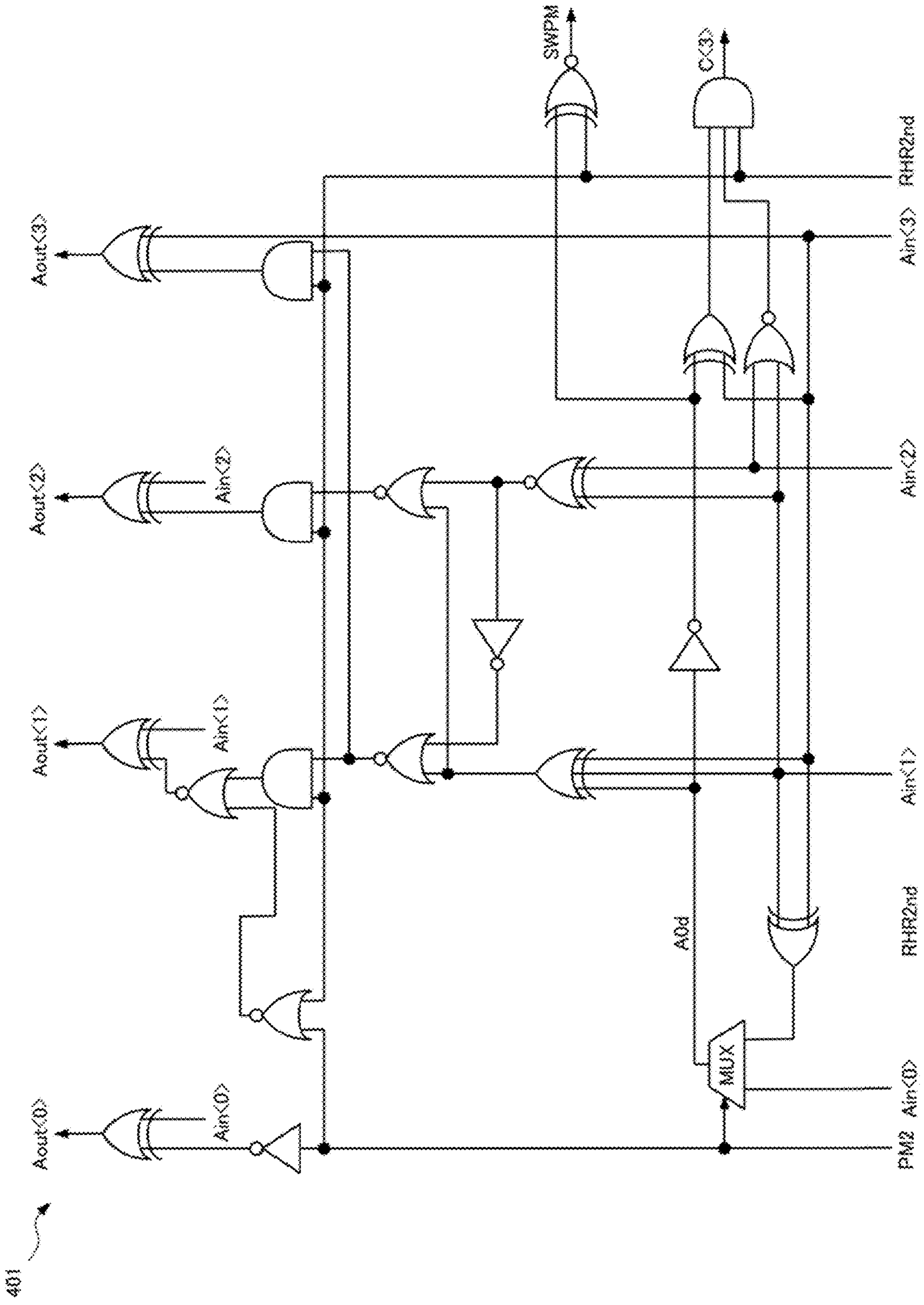
FIG. 13 is a circuit diagram showing the structure of the RHA calculation unit according to the third embodiment of the present invention.

Referring to the circuit in FIG. 13, based on the combination of the distance switching signal PM2 and the priority switching signal RHR2nd, for the lowest 4 bits, the prioritized adjacent RHA, the non-prioritized adjacent RHA, the prioritized further-adjacent RHA, or the non-prioritized further-adjacent RHA corresponding to the seed address are calculated and output.

Figure 14:
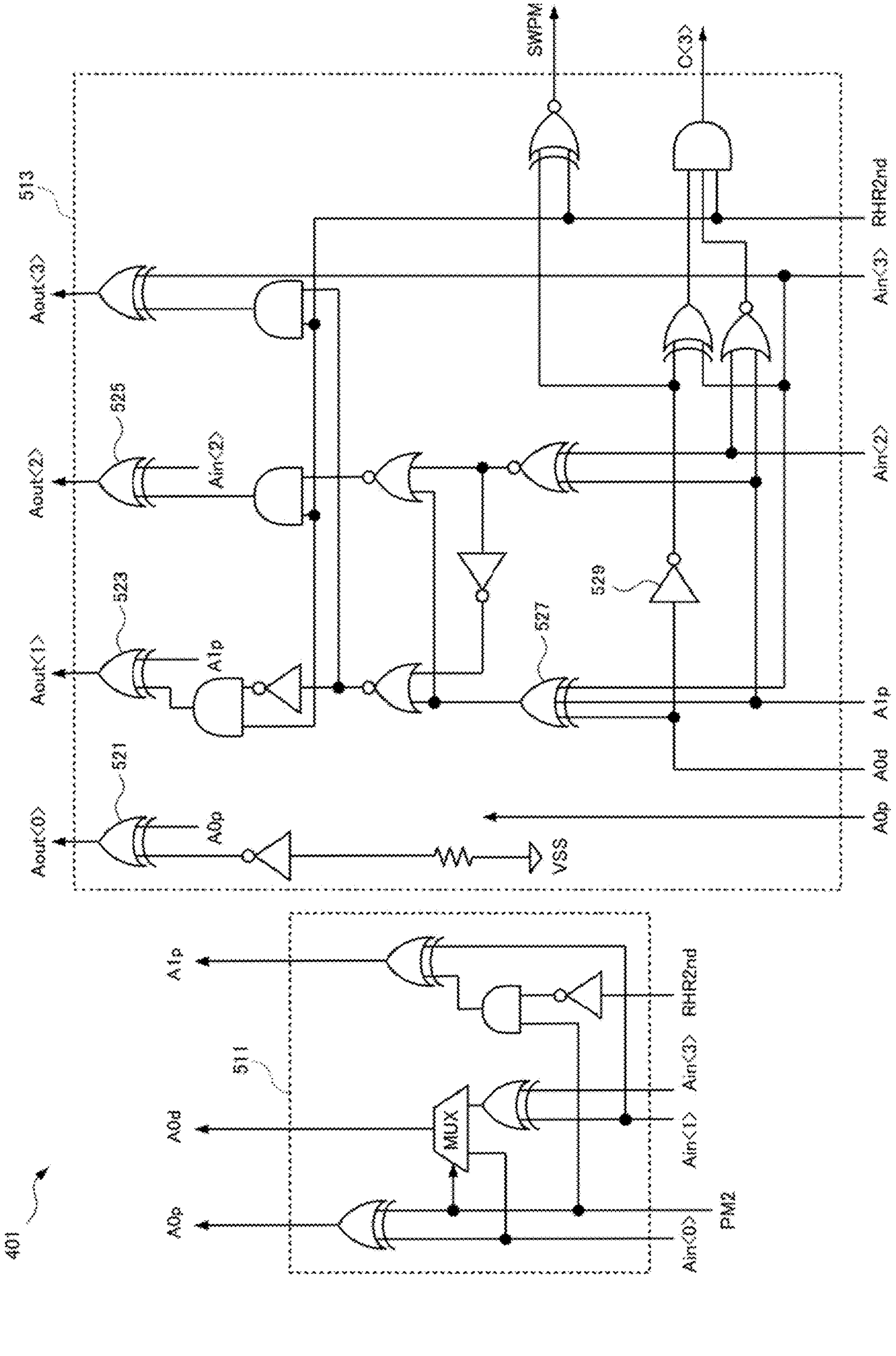
FIG. 14 is a circuit diagram showing the structure of the RHA calculation unit under a first connection state according to the fourth embodiment of the present invention.

The basic structure of the fourth embodiment is the same as that of the first embodiment, so the repeated descriptions are omitted. Compared with the first embodiment, the calculation unit 249 of the fourth embodiment includes the modified 4-bit adder unit 401 with different structure. In the second embodiment, the selection circuit 505 is operated as a functional block. On the other hand, in the fourth embodiment, after the logic circuits inside the selection circuit 505 are realized, the logic circuits related to the bits B0 to B3 of the RHA and the carry CO are integrated into one circuitry. That is, in the fourth embodiment, as shown in FIG. 14, the logic circuits included in the calculation units 501 to 504 and the selection circuit 505 are integrated into one circuitry. Here, the modified 4-bit adder 401 of the fourth embodiment is common to the modified 4-bit adder 401 of the third embodiment.

Unlike the modified 4-bit adder unit 401 of the third embodiment, the modified 4-bit adder unit 401 of the fourth embodiment has compatibility as described below.

Figure 15:
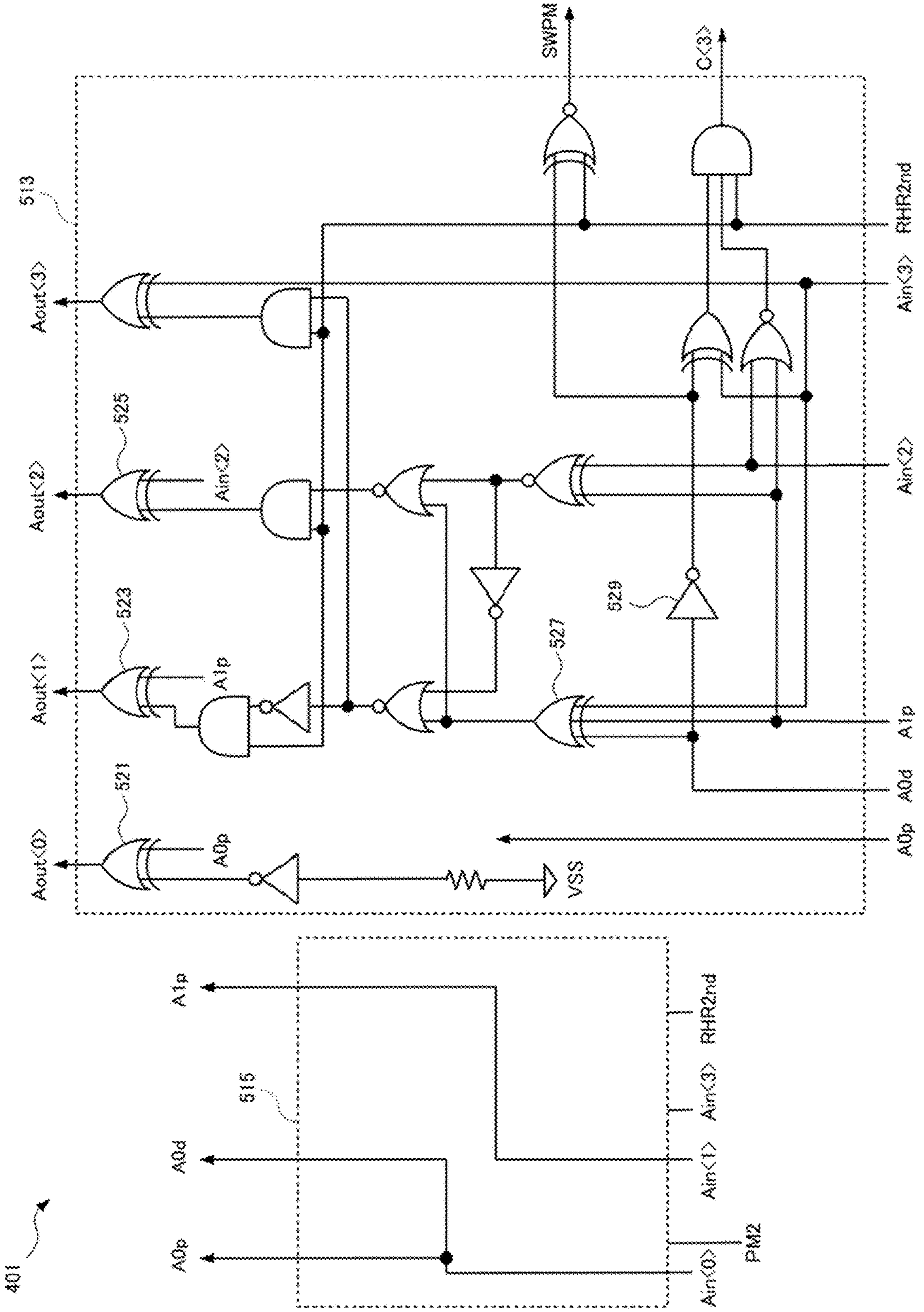
FIG. 15 is a circuit diagram showing the structure of the RHA calculation unit under a second connection state according to the fourth embodiment of the present invention.

As shown in FIG. 14, the logic circuit of the fourth embodiment has a form in which the first part 511 is combined with the second part 513. Here, as shown in FIG. 15, the first part 511 of FIG. 14 can be exchanged with the third part 515, and the third part 515 can be combined with the second part 513. In addition, while the first part 511 and the second part 513 include a combination circuit, and the third part 515 does not include a combination circuit and is comprised only of wiring.

As shown in FIG. 14, when the modified 4-bit adder unit 401 is configured to combine the first part 511 and the second part 513, the modified 4-bit adder unit 401 outputs the adjacent RHA and the further-adjacent RHA. When the modified 4-bit adder unit 401 is configured to combine the third part 515 and the second part 513, the modified 4-bit adder unit 401 does not output the adjacent RHA and the further-adjacent RHA.

To explain in more detail, the first part 511 inputs the lowest bit Ain<0>, the second lowest bit Ain<1>, and the fourth lowest bit Ain<3> of the seed address, the distance switching signal PM2, and the priority switching signal RHR2nd. In addition, the first part 511 directly maintains and outputs the logic levels of the lowest bit Ain<0> and the second lowest bit Ain<1> of the seed address when the distance switching signal PM2 indicates that the current unit period is the A seed period. Furthermore, when the distance switching signal PM2 shows that the current unit period is the B seed period, the first part 511 outputs the lowest bit Ain<0>, the second lowest bit Ain<1>, and the fourth lowest bit Ain<3> of the seed address, the distance switching signal PM2, and the priority switching signal RHR2nd are signals obtained through the first combination circuit included in the first part 511.

That is, when the distance switching signal PM2 shows that the current unit period is the A seed period, the signals A0p and A0d output by the first part 511 have the same logic bit as the lowest bit Ain<0> of the seed address, and the signal Alp output by the first part 511 has the same logic level as the second lowest bit Ain<1> of the seed address.

In addition, when the distance switching signal PM2 shows that the current unit period is the B seed period, the logic level of the signal A0p output by the first part 511 is the logic level of the lowest bit Ain<0> of the inverted seed address. The logic level of the signal A0d has the logic level of the logical XOR of the lowest bit Ain<0> and the fourth lowest bit Ain<3> of the seed address.

When the distance switching signal PM2 shows that the current unit period is the B seed period, and the priority switching signal RHR2nd shows that it is the prioritized period, the signal A1p has the logic level of the second lowest bit Ain<1> of the inverted seed address. On the other hand, when the distance switching signal PM2 shows that the current unit period is the B seed period, and the priority switching signal RHR2nd shows that it is a non-prioritized period, the signal A1p has the same logic level as the second lowest bit Ain<1> of the seed address.

In the second part 513, the signal A0p is input into the logical XOR gate 521 corresponding to the lowest bit Aout<0> of the RHA. Signal A0d is input to bits Aout<3:0> of RHA and the logical XOR gate 527 and inverter 529 associated with signal SWPM. The signal A1p is input into the logical XOR gate 523 corresponding to the second lowest bit Aout<1> of RHA. Referring to FIG. 15, in the third part 515, the bit Ain<0> of the seed address directly becomes the signal A0p and the signal A0d, and the bit Ain<1> of the seed address directly becomes the signal A1p. With this configuration, interchangeability can be achieved. That is, when it is required to calculate only the adjacent RHA, the third part 515 and the second part 513 are combined to form the modified 4-bit adder unit 401. In addition, when it is required to calculate the adjacent RHA and the further-adjacent RHA, the first part 511 and the second part 513 are combined to form the modified 4-bit adder unit 401.

In addition, if there is no need to exchange the first part 511 and the third part 515 for interchangeability, in the circuit of FIG. 14, the first part 511 and the second part 513 may always be combined. Similarly, in the circuit of FIG. 15, the third part 515 and the second part 513 can also be combined.

According to the second to fourth embodiments, the conversion from the seed address to the physical seed address does not require the conversion from the physical RHA to the RHA. According to the RHA calculation circuit of this embodiment, the calculation of the row hammer refresh address can be performed with a smaller circuit scale.

For example, in the above embodiments, although the correspondence between the logical address and the physical address according to the wiring and the configuration of the sub-word driver shown in FIG. 5 is taken as a premise, it may also be based on the correspondence between other configurations. For example, if the calculation can be performed on the simplified circuit of at least one of the two adjacent RHAs corresponding to various sub-addresses, that RHA with the simplified circuit can be set as the prioritized RHA. Similarly, if the calculation can be performed on the simplified circuit at least one of the two adjacent RHAs corresponding to various sub-addresses, that RHA with the simplified circuit can be set as the prioritized RHA.

What is claimed is:

1. A row hammer refresh address calculation circuit for calculating row hammer refresh addresses, comprising:

a calculation unit, configured to calculate, in a memory array that has a plurality of memory cells arranged in rows and columns, an upper-side adjacent row hammer refresh address (RHA) and a lower-side adjacent RHA using a first operation or a second operation, and to calculate an upper-side further-adjacent RHA and a lower-side further-adjacent RHA by a third operation or a fourth operation, wherein the second operation performs more operations than the first operation, and the fourth operation performs more operations than the third operation; and a control unit, configured to control operations of the calculation unit, and when the seed address is refreshed, an address obtained in the first operation is used as a prioritized adjacent RHA and is calculated first by the first operation, and an address obtained in the third operation is used as a prioritized further-adjacent RHA and is calculated first by the third operation, wherein the upper-side adjacent RHA corresponds to an upper-side adjacent word line that corresponds to a word line allocated to a seed address, and the lower-side adjacent RHA corresponds to a lower-side adjacent word line that corresponds to the word line allocated to the seed address;

wherein the upper-side further-adjacent RHA corresponds to an upper-side further-adjacent word line that corresponds to the word line allocated to the seed address, and the lower-side further-adjacent RHA corresponds to a lower-side further-adjacent word line that corresponds to the word line allocated to the seed address; and wherein the address obtained in the first operation is from the upper-side adjacent RHA and the lower-side adjacent RHA corresponding to the refreshed seed address, and the address obtained in the third operation is from the upper-side further-adjacent RHA and the lower-side further-adjacent RHA corresponding to the refreshed seed address.

2. The RHA calculation circuit as claimed in claim 1, wherein the control unit provides a first identification signal and a second identification signal to the calculation unit;

wherein the first identification signal is configured to identify whether a current unit period is an A seed period or a B seed period, and wherein the A seed period is configured to calculate the upper-side adjacent RHA or the lower-side adjacent RHA based on a seed address of the A seed, and the B seed period is configured to calculate the upper-side adjacent RHA or the lower-side adjacent RHA based on a seed address of the B seed;

wherein the second identification signal is configured to identify whether the current unit period is a prioritized period or a non-prioritized period, wherein the prioritized period is configured to generate a prioritized RHA starting from the beginning of the unit period, and the non-prioritized period is configured to generate a non-prioritized RHA starting during the unit period; and wherein according to the first identification signal and the second identification signal, the calculation unit calculates the prioritized adjacent RHA using the first operation based on the seed address of the A seed during the A seed period that is the prioritized period, and calculates the prioritized further-adjacent RHA through the third operation based on the seed address of the B seed during the B seed period that is the prioritized period.

3. The RHA calculation circuit as claimed in claim 2, wherein the calculation unit calculates the non-prioritized adjacent RHA using the second operation based on the seed address of the A seed during the A seed period that is the non-prioritized period.

4. The RHA calculation circuit as claimed in claim 3, wherein the calculation unit calculates the non-prioritized further-adjacent RHA through the fourth operation based on the seed address of the B seed during the B seed period that is the non-prioritized period.

5. The RHA calculation circuit as claimed in claim 2, wherein if the seed address of the A seed is refreshed during the A seed period that is the non-prioritized period, the calculation unit continues the A seed period after the current A seed period is over; and wherein during the continued A seed period that is the prioritized period, the calculation unit calculates the prioritized adjacent RHA through the first operation based on the seed address of the A seed that is refreshed during the A seed period that is the non-prioritized period.

6. The RHA calculation circuit as claimed in claim 2, wherein if the seed address of the A seed is not refreshed during the A seed period that is the non-prioritized period, the calculation unit continues the B seed period after the current A seed period is over; and wherein during the refreshed B seed period that is the prioritized period, the calculation unit calculates the prioritized further-adjacent RHA through the third operation based on the seed address of the B seed.

7. The RHA calculation circuit as claimed in claim 2, wherein if the prioritized period is changed to the non-prioritized period during the B seed period, the calculation unit calculates the non-prioritized further-adjacent RHA through the fourth operation based on the seed address of the B seed that is used to calculate the non-prioritized further-adjacent RHA that is output before the change.

8. The RHA calculation circuit as claimed in claim 2, wherein if the seed address of the B seed is refreshed during the B seed period that is the non-prioritized period, the calculation unit continues the B seed period after the current B seed period is over; and wherein during the continued B seed period that is the prioritized period, the calculation unit calculates the prioritized further-adjacent RHA through the third operation based on the seed address of the B seed that is refreshed during the B seed period that is the non-prioritized period.

9. The RHA calculation circuit as claimed in claim 2, wherein if the seed address of the B seed is not refreshed during the B seed period that is the non-prioritized period, the calculation unit continues the A seed period after the current B seed period is over; and wherein during the refreshed A seed period that is the prioritized period, the calculation unit calculates the prioritized adjacent RHA through the first operation based on the seed address of the A seed.

10. The RHA calculation circuit as claimed in claim 2, wherein:

the calculation unit includes:

a first part, configured to:

input a lowest bit, a second lowest bit, and a fourth lowest bit of the seed address, the first identification signal, and the second identification signal;

output a signal maintaining the logic levels of the lowest bit and the second lowest bit of the seed address when the first identification signal shows that the current unit period is the A seed period; and output a signal that allows the lowest bit, the second lowest bit, and the fourth lowest bit of the seed address, the first identification signal, and the second identification signal to be obtained from a first combination circuit included in the first part; and a second part, configured to output the lowest four bits of the RHA that allows the signal input from the first part, the third lowest bit and the fourth lowest bit of the seed address, and the second identification signal to be obtained from a second combination circuit included in the second part;

wherein when the first part is connected to the second part, allocates the parts of both the calculation unit and the control unit associated to the adjacent RHA and the further-adjacent RHA in the RHA calculation circuit;

wherein when the second part is connected to a third part, the second part outputs the lowest four bits of the RHA and allocates the parts of the calculation unit and the control unit associated with the adjacent RHA in the calculation circuit corresponding to the RHA calculation circuit; and wherein the third part inputs the lowest bit and the second lowest bit of the seed address and outputs the signal maintaining the logic levels of the lowest bit and the second lowest bit of the seed address, and wherein the lowest four bits of the RHA allows the signal input from the third part, the third lowest bit and the fourth lowest bit of the seed address, and the second identification signal to be obtained from a second combination circuit included in the second part.

11. A semiconductor memory device, comprising:

memory array, including a plurality of memory cells arranged in rows and columns; and the row hammer refresh address (RHA) calculation circuit as claimed in claim 1;

wherein the memory cells corresponding to the word line having a row address of the RHA calculated by the RHA calculation circuit are refreshed.

12. A row hammer refresh address calculation method for calculating a row hammer refresh address, comprising:

calculation operations, calculating, in a memory array including a plurality of memory cells arranged in rows and columns, an upper-side adjacent row hammer refresh address (RHA) and a lower-side adjacent RHA by a first operation or a second operation, and calculating an upper-side further-adjacent RHA and a lower-side further-adjacent RHA by a third operation or a fourth operation, wherein the second operation performs more operations than the first operation, and the fourth operation performs more operations than the third operation; and control operations that control the calculation operations, wherein when the seed address is refreshed, an address obtained in the first operation is used as a prioritized adjacent RHA and is calculated first by the first operation, and an address obtained in the third operation is used as a prioritized further-adjacent RHA and is calculated first by the third operation, wherein the upper-side adjacent RHA corresponds to an upper-side adjacent word line that corresponds to a word line allocated to a seed address, and the lower-side adjacent RHA corresponds to a lower-side adjacent word line that corresponds to the word line allocated to the seed address;

wherein the upper-side further-adjacent RHA corresponds to an upper-side further-adjacent word line that corresponds to the word line allocated to the seed address, and the lower-side further-adjacent RHA corresponds to a lower-side further-adjacent word line that corresponds to the word line allocated to the seed address; and wherein the address obtained in the first operation is from the upper-side adjacent RHA and the lower-side adjacent RHA corresponding to the refreshed seed address, and the address obtained in the third operation is from the upper-side further-adjacent RHA and the lower-side further-adjacent RHA corresponding to the refreshed seed address.

* * * * *